(12) United States Patent
Sueyoshi et al.

(10) Patent No.: US 9,779,036 B2
(45) Date of Patent: Oct. 3, 2017

(54) COMMUNICATION DEVICE, INFORMATION PROCESSING METHOD, AND PROGRAM

(71) Applicant: Sony Corporation, Tokyo (JP)

(72) Inventors: Masahiro Sueyoshi, Kanagawa (JP); Tsutomu Nakatsuru, Tokyo (JP)

(73) Assignee: Sony Corporation (JP)

( * ) Notice: Subject to any disclaimer, the term of this patent is extended or adjusted under 35 U.S.C. 154(b) by 21 days.

(21) Appl. No.: 13/945,405

(22) Filed: Jul. 18, 2013

(65) Prior Publication Data

US 2014/0032790 A1    Jan. 30, 2014

(30) Foreign Application Priority Data

Jul. 30, 2012  (JP) ................................ 2012-168112

(51) Int. Cl.

| | |
|---|---|
| *G06F 3/00* | (2006.01) |
| *G06F 13/10* | (2006.01) |
| *H04L 29/08* | (2006.01) |
| *G06F 9/445* | (2006.01) |
| *G06F 13/38* | (2006.01) |
| *G11C 7/10* | (2006.01) |

(Continued)

(52) U.S. Cl.
CPC .......... *G06F 13/10* (2013.01); *G06F 9/44536* (2013.01); *H04L 67/34* (2013.01); *G06F 1/3203* (2013.01); *G06F 1/3256* (2013.01); *G06F 3/13* (2013.01); *G06F 13/385* (2013.01); *G11C 7/1045* (2013.01)

(58) Field of Classification Search
None
See application file for complete search history.

(56) References Cited

U.S. PATENT DOCUMENTS

| | | | |
|---|---|---|---|
| 7,881,709 B2 | 2/2011 | Wakasa et al. | |
| 2006/0020912 A1* | 1/2006 | Illowsky et al. ............. | 717/103 |

(Continued)

FOREIGN PATENT DOCUMENTS

| | | |
|---|---|---|
| CN | 101478461 A | 7/2009 |
| CN | 102510392 A | 6/2012 |

(Continued)

OTHER PUBLICATIONS

Chinese First Office Action for Application No. 201310311476.2 dated Mar. 20, 2017.

(Continued)

*Primary Examiner* — Henry Tsai
*Assistant Examiner* — Aurangzeb Hassan
(74) *Attorney, Agent, or Firm* — Lerner, David, Littenberg, Krumholz & Mentlik, LLP

(57) ABSTRACT

A device may include a control unit to control determination of a processing mode of at least two processing modes and in which an application is executed. The at least two processing modes may include a first processing mode in which the application is executed based on first identification information directly indicating the application and a second processing mode in which the application is executed based on second identification information indirectly indicating the application, where the first identification information and the second identification information are transmitted from an external device through a communication channel.

22 Claims, 12 Drawing Sheets

(51) Int. Cl.
*G06F 1/32* (2006.01)
*G06F 3/13* (2006.01)

(56) References Cited

U.S. PATENT DOCUMENTS

| | | | |
|---|---|---|---|
| 2011/0092185 A1* | 4/2011 | Garskof | 455/411 |
| 2011/0111777 A1 | 5/2011 | Wakasa et al. | |
| 2011/0145842 A1* | 6/2011 | Tofighbakhsh et al. | 719/328 |
| 2012/0079080 A1* | 3/2012 | Pishevar | 709/220 |
| 2012/0094648 A1* | 4/2012 | Fan et al. | 455/422.1 |
| 2013/0083059 A1* | 4/2013 | Hwang et al. | 345/629 |
| 2013/0097179 A1* | 4/2013 | Moshrefi et al. | 707/748 |
| 2013/0097682 A1* | 4/2013 | Zeljkovic et al. | 726/7 |
| 2013/0142363 A1* | 6/2013 | Amento et al. | 381/151 |
| 2013/0183952 A1* | 7/2013 | Davis | H04W 4/001 455/418 |
| 2013/0309139 A1* | 11/2013 | Kimura | 422/106 |

FOREIGN PATENT DOCUMENTS

| | | |
|---|---|---|
| JP | H11353425 A | 12/1999 |
| JP | 2002236591 A | 8/2002 |
| JP | 2005108044 A | 4/2005 |
| JP | 2007-066042 A | 3/2007 |
| JP | 2010128522 A | 6/2010 |
| JP | 2011086016 A | 4/2011 |
| WO | 2008050439 A1 | 5/2008 |

OTHER PUBLICATIONS

Japanese Office Action for JP Application No. 2012168112, dated Nov. 24, 2015.
Japanese Office Action for Application No. 2012-168112 dated Jun. 14, 2016.

* cited by examiner

FIG. 2

| ID | APPLICATION | FUNCTION CONTENTS | EXPLANATION |
|---|---|---|---|
| 1 | APPLICATION A | IMAGE DISPLAY | CAUSE COMMUNICATION DEVICE 200 TO DISPLAY IMAGE DATA OF COMMUNICATION DEVICE 100 |
| 2 | APPLICATION B | SOUND REPRODUCTION | CAUSE COMMUNICATION DEVICE 200 TO REPRODUCE SOUND DATA OF COMMUNICATION DEVICE 100 |
| 3 | APPLICATION C | DATA SHARING | CAUSE DATA OF COMMUNICATION DEVICE 100 TO BE SHARED WITH COMMUNICATION DEVICE 200 |
| 4 | APPLICATION D | PROXY EXECUTION | CAUSE COMMUNICATION DEVICE 200 TO EXECUTE APPLICATION OF COMMUNICATION DEVICE 100 BY PROXY |
| ... | ... | ... | ... |

FIG. 3

| ID | OPERATION CATEGORY | EXPLANATION |
|---|---|---|
| 1 | SCREEN DISPLAY DEVICE | HAVE DISPLAY DEVICE CAPABLE OF DISPLAYING IMAGE DATA |
| 2 | SOUND DISPLAY DEVICE | DEVICE CAPABLE OF REPRODUCING SOUND |
| 3 | DATA SHARING DEVICE | DEVICE CAPABLE OF RECORDING DATA |
| 4 | DATA READING DEVICE | DEVICE CAPABLE OF READING NETWORK CONNECTION INFORMATION |
| 5 | EXTERNAL COMMUNICABLE DEVICE | DEVICE CAPABLE OF PERFORMING TETHERING OPERATION |
| ⋮ | ⋮ | ⋮ |

| START-UP MODE |
| APPLICATION ID DESIGNATION NUMBER (m) |
| APPLICATION ID1 |
| APPLICATION ID2 |
| ⋮ |
| APPLICATION IDm |
| DEVICE ID |
| FLAG INDICATING PRESENCE/ABSENCE OF RECORD IN OPPOSITE DEVICE |
| PAYLOAD |

B →

| APPLICATION ID | ID | ACTION SERIAL NUMBER |

C →

| DEVICE ID | ID |

COMMUNICATION DEVICE, INFORMATION PROCESSING METHOD, AND PROGRAM

CROSS-REFERENCE TO RELATED APPLICATIONS

The present application claims priority from JP 2012-168112 filed Jul. 30, 2012 in the Japanese Patent Office, the disclosure of which is hereby incorporated herein by reference.

BACKGROUND

The present disclosure relates to a communication device, an information processing method, and a program.

Technology for causing a communication device to execute an application indicated by information based on the information indicating the application acquired from an external device has been developed. An example of the above-described technology is disclosed in Japanese Unexamined Patent Application Publication No. 2007-66042.

SUMMARY

For example, a communication device to which the technology disclosed in Japanese Unexamined Patent Application Publication No. 2007-66042 has been applied executes an application corresponding to identification information of the application based on the identification information of the application including an identifier (ID) or the like acquired from an external device. Consequently, for example, it is possible to cause the communication device to perform a process to be implemented by the application designated from the external device using the technology disclosed in Japanese Unexamined Patent Application Publication No. 2007-66042.

However, for example, when the technology disclosed in Japanese Unexamined Patent Application Publication No. 2007-66042 is used, it is possible to cause the communication device to execute only a specific application corresponding to an ID or the like included in the identification information of the application. Consequently, for example, even when the technology disclosed in Japanese Unexamined Patent Application Publication No. 2007-66042 is used, it is difficult to cause the communication device to more flexibly perform a process corresponding to information transmitted from the external device.

It is desirable to provide a novel and improved communication device, information processing method, and program capable of more flexibly performing a process corresponding to processing control information based on the acquired processing control information.

According to an embodiment of the present disclosure, there is provided a communication device including a first communication unit configured to communicate with an external device through one communication channel, a determination unit configured to determine a processing mode in which an application is executed based on processing control information including first identification information directly indicating the application or second identification information indirectly indicating the application acquired through the one communication channel, and a processing unit configured to execute the application corresponding to the processing control information based on the determined processing mode.

According to an embodiment of the present disclosure, there is provided a communication device including a communication unit configured to communicate with an external device through one communication channel, an information generation unit configured to generate processing control information including first identification information directly indicating an application or second identification information indirectly indicating the application, and a transmission control unit configured to cause the communication unit to transmit the processing control information.

According to an embodiment of the present disclosure, there is provided an information processing method including determining a processing mode in which an application is executed based on processing control information including first identification information directly indicating the application or second identification information indirectly indicating the application acquired through one communication channel, and executing the application corresponding to the processing control information based on the determined processing mode.

According to an embodiment of the present disclosure, there is provided an information processing method including generating processing control information including first identification information directly indicating an application or second identification information indirectly indicating the application, and transmitting the processing control information to an external device through one communication channel.

According to an embodiment of the present disclosure, there is provided a program for causing a computer to execute the steps of determining a processing mode in which an application is executed based on processing control information including first identification information directly indicating the application or second identification information indirectly indicating the application acquired through one communication channel, and executing the application corresponding to the processing control information based on the determined processing mode.

According to an embodiment of the present disclosure, there is provided a program for causing a computer to execute the steps of generating processing control information including first identification information directly indicating an application or second identification information indirectly indicating the application, and transmitting the processing control information to an external device through one communication channel.

According to an embodiment of the present disclosure, there is provided a device that may include a control unit to control determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

According to an embodiment of the present disclosure, there is provided a communication method that may include controlling, by a processing unit, determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

According to an embodiment of the present disclosure, there is provided a non-transitory recording medium on which is recorded a program executable by a computer, where the program may include controlling determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

According to the embodiments of the present disclosure described above, a process corresponding to processing control information can be more flexibly performed based on the acquired processing control information.

BRIEF DESCRIPTION OF THE DRAWINGS

FIG. 2 is an explanatory diagram illustrating an example of first identification information according to this embodiment;

FIG. 3 is an explanatory diagram illustrating an example of second identification information according to this embodiment;

FIGS. 4A to 4C are explanatory diagrams illustrating an example of processing control information according to this embodiment;

DETAILED DESCRIPTION OF THE EMBODIMENT(S)

Figure 1:
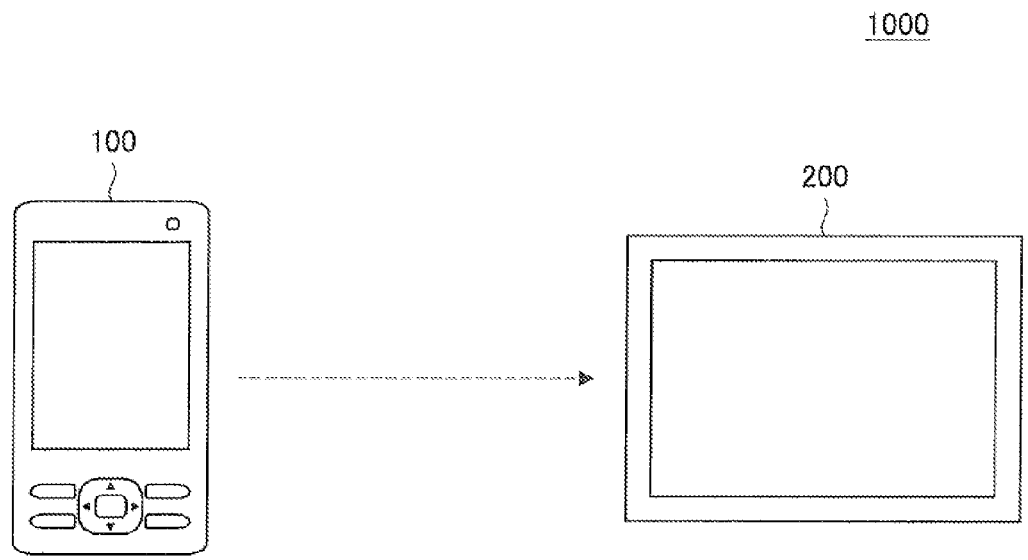
FIG. 1 is an explanatory diagram illustrating an outline of an information processing method according to this embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

In addition, hereinafter, description will be given in the following order.

1. Information processing method according to this embodiment
2. Communication device according to this embodiment
3. Program according to this embodiment (Information Processing Method According to this Embodiment)

Before the description of a configuration of the communication device according to this embodiment, the information processing method according to this embodiment will first be described.

[1] Outline of Information Processing Method According to this Embodiment

FIG. 1 is an explanatory diagram illustrating the outline of the information processing method according to this embodiment, and illustrates an example of an information processing system 1000 according to this embodiment to which the information processing method according to this embodiment is applied.

The information processing system 1000, for example, includes a communication device 100 configured to perform a process related to generation of processing control information according to this embodiment and a communication device 200 configured to perform a process related to the information processing method according to this embodiment as will be described later. Here, although an example in which the communication device 100 is a portable telephone (or smart phone) and the communication device 200 is a tablet type terminal is illustrated in FIG. 1, the communication devices 100 and 200 according to this embodiment are not limited to the example illustrated in FIG. 1.

The communication devices 100 and 200 perform communication through a first communication channel (one communication channel) formed according to a first communication scheme.

Here, the first communication channel according to this embodiment, for example, is formed according to a communication scheme in which the communication device 100 and the communication device 200 can perform one-to-one communication with no particular connection setup by a user. An example of the first communication channel according to this embodiment is a communication channel formed according to near field communication (NFC) using a carrier of a specific frequency such as 13.56 [MHz].

When the first communication channel according to this embodiment is the communication channel formed according to NFC, for example, the user of the communication device 100 or the user of the communication device 200 performs a touch operation (an example of an operation of maintaining a distance between the communication device 100 and the communication device 200 as a communicable distance; this is assumed to be substantially the same hereinafter), and hence communication through the first communication channel is performed between the communication device 100 and the communication device 200.

In addition, when the first communication channel according to this embodiment is the communication channel formed according to NFC, at least one of the communication device 100 and the communication device 200 has an initiator function (in other words, a reader/writer function) in NFC, and at least one of the communication device 100 and the communication device 200 functions as a reader/writer configured to independently transmit a carrier. In addition, when the first communication channel according to this embodiment is the communication channel formed according to NFC, a device which does not function as at least a reader/writer between the communication device 100 and the communication device 200 has a target function (in other words, a card function).

Also, the first communication channel according to this embodiment is not limited to the above. For example, the first communication channel according to this embodiment may be a communication channel formed according to infrared communication in which infrared light is used. Hereinafter, an example in which the first communication channel according to this embodiment is a communication channel formed according to NFC will be described.

In addition, communication between the communication device 100 and the communication device 200 is not limited to communication through the above-described first communication channel. For example, the communication device 100 and the communication device 200 may further perform communication through one or more second communication channels (other communication channels) different from the first communication channel.

Here, an example of the second communication channel according to this embodiment is a communication channel formed according to a communication scheme in which predetermined connection setup is necessary for one-to-one communication by the communication device 100 and the communication device 200. An example of the second communication channel according to this embodiment is a communication channel formed according to wireless communication using Institute of Electrical and Electronics Engineers (IEEE) 802.15.1 (also referred to as "Bluetooth" (registered trademark)), wireless communication using a wireless local area network (LAN) such as IEEE 802.11b (also referred to as "wireless fidelity (Wi-Fi)"), wireless communication using ZigBee (registered trademark), or the like.

In the information processing system 1000, for example, the communication device 100 generates processing control information (as will be described later), and transmits the generated processing control information to the communication device 200 via the first communication channel. In addition, in the information processing system 1000, for example, the communication device 200 performs a process related to the information processing method according to this embodiment based on the processing control information acquired through the first communication channel, and executes an application corresponding to the processing control information. Hereinafter, like the communication device 100, a communication device configured to perform a process related to generation of the processing control information may be shown as a "communication device of the side at which the processing control information is generated." In addition, hereinafter, like the communication device 200, a device configured to process the acquired processing control information by performing the process related to the information processing method according to this embodiment may be shown as a "communication device of the side at which the processing control information is processed."

Here, an example of the processing control information according to this embodiment is data including first identification information directly indicating an application or second identification information indirectly indicating the application. An example of the first identification information according to this embodiment is an ID (hereinafter referred to as "application ID") indicating the application to be executed by the communication device of the side at which the processing control information is processed. In addition, an example of the second identification information according to this embodiment is an ID (hereinafter referred to as "device ID") for causing the communication device of the side at which the processing control information is processed to function as a device having a predetermined function. An example of the device ID is an ID indicating an operation category of the device having the predetermined function.

FIG. 2 is an explanatory diagram illustrating an example of the first identification information according to this embodiment, and illustrates an example of information (data) in which the first identification information is associated with applications. In FIG. 2, an example of the information in which the first identification information is associated with the applications is a table. In addition, in FIG. 2, the "ID" corresponds to the first identification information.

As illustrated in FIG. 2, the ID (first identification information) is associated with the applications in one-to-one correspondence. In addition, as illustrated in FIG. 2, in the table in which the first identification information is associated with the applications, for example, information indicating function contents of each application or information representing the explanation of a function may be recorded. Here, for example, an example of an application D related to "proxy execution" illustrated in FIG. 2 is an application for performing a process corresponding to an operation of selecting a channel of a television broadcast performed in an external device such as a remote controller within the communication device of the side at which the processing control information is processed such as a television receiver.

When the processing control information including the first identification information is generated, the communication device 100, for example, specifies an application ID corresponding to an application to be executed by the communication device 200 by referring to the information in which the first identification information is associated with the applications as illustrated in FIG. 2. Accordingly, the communication device 100 generates processing control information including the specified application ID. Also, a specific example of the processing control information according to this embodiment will be described later.

Here, the communication device 100, for example, refers to the information in which the first identification information is associated with the applications by reading the information in which the first identification information is associated with the applications stored in a storage unit (as will be described later) provided in the communication device 100 or an external recording medium connected to the communication device 100 from the storage unit (as will be described later) or the like. Also, the communication device 100, for example, may communicate with an external device such as a server and refer to the information in which the first identification information is associated with the applications by acquiring the information in which the first identification information is associated with the applications stored in the external device from the external device.

When the processing control information including the first identification information has been acquired through the first communication channel, the communication device 200 determines a first processing mode in which an application corresponding to the first identification information is executed in a process related to the information processing method according to this embodiment as will be described later. Hereinafter, the first processing mode according to this embodiment may be represented as an "application ID mode."

When the first processing mode is determined, the communication device 200, for example, specifies the application corresponding to the first identification information by referring to the information in which the first identification information is associated with the applications as illustrated in FIG. 2.

Here, the communication device 200, for example, refers to the information in which the first identification information is associated with the applications by reading the information in which the first identification information is associated with the applications stored in a storage unit (as will be described later) provided in the communication device 200 or an external recording medium connected to the communication device 200 from the storage unit (as will be described later) or the like. Also, the communication device 200, for example, may communicate with the external device such as the server and refer to the information in which the first identification information is associated with the applications by acquiring the information in which the first identification information is associated with the applications stored in the external device from the external device.

When the application corresponding to the first identification information is specified, the communication device 200 executes the specified application corresponding to the first identification information.

Here, the communication device 200, for example, determines whether the specified application corresponding to the first identification information is stored in the storage unit (as will be described later), the external recording medium, or the like. Accordingly, the communication device 200, for example, executes the selectively specified application corresponding to the first identification information based on the determination result.

More specifically, for example, when the specified application corresponding to the first identification information is stored in the storage unit (as will be described later) or the like, the communication device 200 executes the application (the specified application corresponding to the first identification information) stored in the storage unit (as will be described later) or the like.

In addition, for example, when no specified application corresponding to the first identification information is stored in the storage unit (as will be described later) or the like, that is, when there is no specified application corresponding to the first identification information, the communication device 200 does not execute the specified application corresponding to the first identification information. Also, for example, when no specified application corresponding to the first identification information is stored in the storage unit (as will be described later) or the like, the communication device 200, for example, may acquire the specified application corresponding to the first identification information from the external device such as the server, and execute the acquired application (the specified application corresponding to the first identification information).

Also, the information in which the first identification information is associated with the applications is not limited to the example illustrated in FIG. 2. An example of the information in which the first identification information is associated with the applications is an arbitrary format of data in which the first identification information can be associated with the applications as in a database (DB) such as a relational DB (RDB). In addition, "function contents" or "explanation" illustrated in FIG. 2 may not be included in the information in which the first identification information is associated with the applications.

FIG. 3 is an explanatory diagram illustrating an example of second identification information according to this embodiment, and illustrates an example of information (data) in which the second identification information is associated with types of devices having predetermined functions. In FIG. 3, the example of the information in which the second identification information is associated with the types of devices having the predetermined functions is a table. In addition, in FIG. 3, an "ID" corresponds to the second identification information, and an "operation category" corresponds to the type of device having the predetermined function.

As illustrated in FIG. 3, IDs (second identification information), for example, are associated with the types (operation categories) of devices having the predetermined functions in one-to-one correspondence. In addition, as illustrated in FIG. 3, information representing the explanation of the types (operation categories) of devices having the predetermined functions may be recorded in the table in which the second identification information is associated with the types (operation categories) of devices having the predetermined functions. Here, the types (operation categories) of devices having the predetermined functions according to this embodiment are information prescribing a type of device to function for the communication device of the side at which the processing control information is processed.

When the processing control information including the second identification information is generated, the communication device 100, for example, specifies a device ID indicating a type of device to function for the communication device 200 by referring to the "information in which the second identification information is associated with the types (operation categories) of devices having the predetermined functions" as illustrated in FIG. 3. Accordingly, the communication device 100 generates the processing control information including the specified device ID.

Here, the communication device 100, for example, refers to the "information in which the second identification information is associated with the types (operation categories) of devices having the predetermined functions" by reading the "information in which the second identification information is associated with the types (operation categories) of devices having the predetermined functions" stored in the storage unit (as will be described later) provided in the communication device 100 or the external recording medium connected to the communication device 100 from the storage unit (as will be described later) or the like. Also, the communication device 100, for example, may communicate with the external device such as the server and refer to the "information in which the second identification information is associated with the types (operation categories) of devices having the predetermined functions" by acquiring the "information in which the second identification information is associated with the types (operation categories) of devices having the predetermined functions" stored in the external device from the external device.

When the processing control information including the second identification information has been acquired through the first communication channel, the communication device 200 determines a second processing mode in which one or more applications corresponding to the second identification information are executed in the process related to the information processing method according to this embodiment as will be described later. Hereinafter, the second processing mode according to this embodiment may be represented as a "device ID mode."

When the second processing mode is determined, the communication device 200, for example, specifies a type (operation category) of device having a predetermined function corresponding to the second identification information by referring to the "information in which the second identification information is associated with the types (operation categories) of devices having the predetermined functions" as illustrated in FIG. 3.

Here, the communication device 200, for example, refers to the "information in which the second identification information is associated with the types (operation categories) of devices having the predetermined functions" by reading the "information in which the second identification information is associated with the types (operation categories) of devices having the predetermined functions" stored in the storage unit (as will be described later) provided in the communication device 200 or the external recording medium connected to the communication device 200 from the storage unit (as will be described later) or the like. Also, the communication device 200, for example, may communicate with the external device such as the server and refer to the "information in which the second identification information is associated with the types (operation categories) of devices having the predetermined functions" by acquiring the "information in which the second identification information is associated with the types (operation categories) of devices having the predetermined functions" stored in the external device from the external device.

Also, for example, there may be no type (operation category) of device having a predetermined function corresponding to the second identification information in the "information in which the second identification information is associated with the types (operation categories) of devices having the predetermined functions" as illustrated in FIG. 3. In addition, when there is no type of device having a predetermined function corresponding to second identification information in the "information in which the second identification information is associated with the types (operation categories) of devices having the predetermined functions" as illustrated in FIG. 3 as described above, it is difficult for the communication device 200 to specify a type (operation category) of device having the predetermined function corresponding to the second identification. Consequently, when it is difficult for the communication device 200 to specify the type (operation category) of device having the predetermined function corresponding to the second identification information as described above, the communication device 200, for example, does not execute the application corresponding to the processing control information.

In addition, when the type (operation category) of device having the predetermined function corresponding to the second identification information is specified, the communication device 200 specifies one or more applications for implementing a function indicated by the type (operation category) of device having the predetermined function corresponding to the second identification information based on the specified type (operation category) of device having the predetermined function corresponding to the second identification information. The communication device 200, for example, specifies the one or more applications for implementing the function indicated by the type (operation category) of device having the predetermined function corresponding to the second identification information using "information (data) in which a type (operation category) of device having a predetermined function is associated with one or more applications" stored in the storage unit (as will be described later) or the like.

Here, when the type (operation category) having the predetermined function is associated with a plurality of applications in the "information (data) in which the type (operation category) of device having the predetermined function is associated with the one or more applications," order of execution, for example, is prescribed in the plurality of applications. When the order of execution is prescribed in the plurality of applications, the applications are executed in the prescribed order in the communication device of the side at which the processing control information is processed.

Also, in the "information (data) in which the type (operation category) of device having the predetermined function is associated with the one or more applications," for example, the order of execution may not be prescribed in the plurality of applications. When the order of execution is not prescribed in the plurality of applications, the communication device of the side at which the processing control information is processed, for example, can execute the applications in an arbitrary order.

In addition, an example of the "information (data) in which the type (operation category) of device having the predetermined function is associated with the one or more applications" according to this embodiment is a table or a DB such as the RDB. Also, the "information (data) in which the type (operation category) of device having the predetermined function is associated with the one or more applications" according to this embodiment may be an arbitrary format of data in which the type (operation category) of device having the predetermined function can be associated with the one or more applications.

For example, the one or more applications specified as described above correspond to those corresponding to the second identification information. That is, while the application ID illustrated in FIG. 2 (the first identification information according to this embodiment) is referred to as data directly indicating the application, the second identification information according to this embodiment like the device ID illustrated in FIG. 3 is referred to as data indirectly indicating the application.

Accordingly, when one or more applications corresponding to the second identification information are specified, the communication device 200 executes the specified application corresponding to the second identification information. The one or more applications corresponding to the second identification information are executed, and hence the communication device 200 functions as a device having a predetermined function corresponding to the second identification information.

Here, the communication device 200 determines whether the specified application corresponding to the second identification information is stored in the storage unit (as will be described later), the external recording medium, or the like. Accordingly, the communication device 200, for example, executes the selectively specified application corresponding to the second identification information based on the determination result.

More specifically, for example, when all specified applications corresponding to the second identification information are stored in the storage unit (as will be described later) or the like, the communication device 200, for example, executes the applications (the specified applications corresponding to the second identification information) stored in the storage unit (as will be described later) or the like.

In addition, for example, when some or all of the specified applications corresponding to the second identification information are not stored in the storage unit (as will be described later) or the like, that is, when at least some of the specified applications corresponding to the second identification information are absent, the communication device 200 does not execute the specified applications corresponding to the second identification information. Also, for example, when the at least some of the specified applications corresponding to the second identification information are not stored in the storage unit (as will be described later) or the like, the communication device 200, for example, may acquire the specified applications corresponding to the second identification information from the external device such as the server, and execute the applications stored in the storage unit (as will be described later) or the like and the acquired applications (the specified applications corresponding to the second identification information). In addition, for example, when not all of the specified applications corresponding to the second identification information are stored in the storage unit (as will be described later) or the like, the communication device 200 can execute only some applications (some specified applications corresponding to the second identification information) stored in the storage unit (as will be described later) or the like.

Also, the information in which the second identification information is associated with the types of devices having the predetermined functions is not limited to the example illustrated in FIG. 3. An example of the information in which the second identification information is associated with the types of devices having the predetermined functions is an arbitrary format of data in which the second identification information can be associated with the types of devices having the predetermined functions as in a DB such as an RDB. In addition, the "explanation" illustrated in FIG. 3 may not be included in the information in which the second identification information is associated with the types of devices having the predetermined functions.

In the information processing system 1000, for example, the communication device 200 (the communication device of the side at which processing control information is processed) determines the processing mode (the above-described first or second processing mode) in which the application is executed based on the processing control information acquired through the first communication channel as described above. Accordingly, the communication device 200 executes the application corresponding to the processing control information according to the determined processed mode.

Here, for example, when the first identification information directly indicating the application is included in the processing control information, the communication device 200 executes the application directly indicated by the first identification information (the application corresponding to the first identification information) by determining the first processing mode. In addition, when a plurality of pieces of the first identification information are included in the processing control information, the communication device 200, for example, executes the applications directly indicated by the pieces of the first identification information (the applications corresponding to the first identification information).

Consequently, when the first identification information directly indicating the application is included in the processing control information, the communication device 200 can perform a process to be implemented by the application directly designated in the processing control information.

In addition, for example, when the second identification information indirectly indicating the application is included in the processing control information, the communication device 200 determines the second processing mode, and specifies one or more applications corresponding to the second identification information. Accordingly, the communication device 200 executes the specified one or more applications. The one or more applications corresponding to the second identification information are executed and hence the communication device 200 functions as a device having a predetermined function corresponding to the second identification information.

Consequently, when the second identification information indirectly indicating the application is included in the processing control information, the communication device 200 can perform a process to be implemented by the one or more applications indirectly designated in the processing control information (an application for functioning as a device having a predetermined function corresponding to the second identification information).

Accordingly, the communication device 200 (the communication device of the side at which the processing control information is processed) can more flexibly perform the process corresponding to the processing control information based on the acquired processing control information. In addition, because the process corresponding to the processing control information can be more flexibly performed, the communication device 200 (the communication device of the side at which the processing control information is processed) can deal with various services.

Hereinafter, each of an example of a process related to generation of the processing control information according to this embodiment in the communication device of the side at which the processing control information is generated and an example of a process related to the information processing method according to this embodiment in the communication device of the side at which the processing control information is processed will be described using an example of the communication device 100 and the communication device 200 constituting the information processing system 1000.

[2] Process Related to Generation of Processing Control Information in Communication Device 100 (Communication Device of Side at which Processing Control Information is Generated)

The communication device 100 generates the processing control information (an information generation process) and transmits the generated processing control information through the first communication channel (a transmission control process).

(I) Information Generation Process

The communication device 100, for example, generates the processing control information including the first identification information or the processing control information including the second identification information based on an operation signal corresponding to a user's operation transmitted from an operation unit (as will be described later) provided in the communication device 100 or an operation signal corresponding to the user's operation transmitted from an external operation device such as a remote controller. Here, an example of the operation signal corresponding to the user's operation is a signal (analog signal/digital signal) generated by the operation unit (as will be described later) or the like according to a selection operation (an example of the user's operation) for an operation screen (or a user interface (UI); this is assumed to be substantially the same hereinafter) for selecting an application to be executed by the communication device of the side at which the processing control information is processed or an operation screen for selecting a type of device to function for the communication device of the side at which the processing control information is processed.

Also, the process (information generation process) of the above-described (I) in the communication device 100 is not limited to the process of generating the processing control information based on the operation signal corresponding to the user's operation. For example, the communication device 100 may generate the processing control information including the first identification information or the processing control information including the second identification information based on a transmission command of the processing control information transmitted from the external device.

More specifically, for example, when the operation signal indicating the application to be executed by the communication device 200 (the communication device of the side at which the processing control information is processed) has been acquired, the communication device 100 generates the processing control information including the first identification information. When an operation signal indicating one application to be executed by the communication device 200 has been acquired, the communication device 100 generates processing control information including one piece of the first identification information. In addition, when an operation signal indicating a plurality of applications to be executed by the communication device 200 has been acquired, the communication device 100 generates processing control information including a plurality of pieces of the first identification information.

Here, for example, as described above, the communication device 100 specifies an application ID corresponding to an application to be executed by the communication device 200 by referring to the information in which the first identification information is associated with the applications as illustrated in FIG. 2, and generates processing control information including the specified application ID (an example of the first identification information).

In addition, for example, when an operation signal indicating a type of device to function for the communication device 200 (the communication device of the side at which the processing control information is processed) such as an operation signal indicating a type (operation category) of device having a predetermined function has been acquired, the communication device 100 generates the processing control information including the second identification information.

Here, for example, as described above, the communication device 100 specifies a device ID indicating a type of device to function for the communication device 200 by referring to the "information in which the second identification information is associated with the types (operation categories) of devices having the predetermined functions" as illustrated in FIG. 3. Accordingly, the communication device 100 generates processing control information including the specified device ID (an example of the second identification information).

FIGS. 4A to 4C are explanatory diagrams illustrating an example of the processing control information according to this embodiment. FIG. 4A illustrates an example of a structure of the processing control information according to this embodiment. In addition, FIG. 4B illustrates an example of a structure of an application ID that can be included in the processing control information according to this embodiment, and FIG. 4C illustrates an example of a structure of a device ID that can be included in the processing control information according to this embodiment. Here, in FIGS. 4A to 4C, the example in which the first identification information is the application ID and the second identification information is the device ID is illustrated.

The processing control information according to this embodiment, for example, has a "start-up mode," an "application ID designation number (m)" (m is an integer more than or equal to 1), an "application ID1" to an "application IDm," a "device ID," a "flag indicating the presence/absence of a record in an opposite device," and a "payload." The "payload" collectively represents data that can be included in the processing control information other than the above-described "start-up mode" to the "flag indicating the presence/absence of the record in the opposite device."

The "start-up mode" is data indicating which of the application ID and the device ID is included in the processing control information. In the communication device of the side at which the processing control information is processed, the "start-up mode" is referred to. Accordingly, one of the application ID and the device ID is used in the communication device of the side at which the processing control information is processed. That is, the "start-up mode" is data to be used by the communication device of the side at which the processing control information is processed to determine which of the application ID and the device ID is used to perform the process, that is, determine the processing mode. An example of the "start-up" mode illustrated in FIG. 4A is a flag.

The "application ID designation number (m)" indicates a number of the application ID included in the processing control information. As described above, one or more application IDs (first identification information) can be included in the processing control information. When the communication device 100 generates the processing control information including the first identification information, valid data indicating the number of the application ID (the number of the first identification information) included in the processing control information is recorded in the "application ID designation number (m)." In addition, when the communication device 100 generates the processing control information including the second identification information, for example, invalid data is recorded in the "application ID designation number (m)" or no data is recorded therein.

Each of the "application ID1" to the "application IDm" has an ID and an action serial number as illustrated in FIG. 4B. The ID illustrated in FIG. 4B, for example, represents an ID illustrated in FIG. 2, that is, an application ID itself. The action serial number illustrated in FIG. 4B is a number indicating which of the "application ID1" to the "application IDm" corresponds to each application ID. When the communication device 100 generates the processing control information including the first identification information, for example, valid data including the ID illustrated in FIG. 4B is recorded in the "application ID1" to the "application IDm." In addition, when the communication device 100 generates the processing control information including the second identification information, for example, invalid data is recorded in the "application ID1" to the "application IDm" or no data is recorded therein.

As illustrated in FIG. 4C, the "device ID" has the ID. The ID illustrated in FIG. 4C, for example, represents the ID illustrated in FIG. 3, that is, the device ID itself. When the communication device 100 generates the processing control information including the second identification information, for example, valid data including the ID illustrated in FIG. 4C is recorded in the "device ID." In addition, when the communication device 100 generates the processing control information including the first identification information, for example, invalid data is recorded in the "device ID" or no data is recorded therein.

The "flag indicating the presence/absence of the record in the opposite device" is a flag for controlling recording of history information in the communication device of the side at which the processing control information is processed. For example, when the "flag indicating the presence/absence of the record in the opposite device" does not indicate that the history information is recorded, the communication device 200 (the communication device of the side at which the processing control information is processed) receiving the processing control information does not record the history information. An example of a process related to the recording of the history information in the communication device 200 (the communication device of the side at which the processing control information is processed) will be described later.

The communication device 100, for example, generates the processing control information as illustrated in FIGS. 4A to 4C in the process (information generation process) of the above-described (I). The processing control information is not limited to the example illustrated in FIGS. 4A to 4C.

For example, the "flag indicating the presence/absence of the record in the opposite device" or the "payload" illustrated in FIG. 4A may not be included in the processing control information according to this embodiment.

In addition, common information related to communication through the second communication channel (other communication channel) may be further included in the processing control information according to this embodiment. Here, the common information according to this embodiment is data related to the communication through the second communication channel. The common information according to this embodiment is used to selectively establish the communication through the second communication channel between the communication device 100 (the communication device of the side at which the processing control information is generated) and the communication device 200 (the communication device of the side at which the processing control information is processed).

An example of the information included in the common information according to this embodiment is environmental information indicating an establishment state of communication through the second communication channel (other communication channel). An example of the environmental information according to this embodiment is data (for example, a flag) indicating the presence/absence of the second communication channel established between the communication device 100 (the communication device of the side at which the processing control information is generated) and the communication device 200 (the communication device of the side at which the processing control information is processed).

Also, the environmental information according to this embodiment is not limited to the above. For example, data indicating a communication type (for example, a communication scheme or the like) related to the second communication channel or connection information to be used to establish the communication through the second communication channel may be included in the environmental information according to this embodiment.

Here, an example of the connection information according to this embodiment is data for starting (establishing) the communication through the second communication channel formed by the communication scheme different from a communication scheme forming the first communication channel such as data indicating a connection password. In addition, the connection information according to this embodiment may be data indicating an actual data transmission amount or a delay amount in the second communication channel (for example, when the second communication channel is a data communication network). When the connection information according to this embodiment is the data indicating the actual data transmission amount or the delay amount in the second communication channel, for example, it is possible to perform a process "in which a specific application such as a data transmission application is executed when the delay amount indicated by the connection information according to this embodiment is less than a set delay amount" in the communication device of the side at which the processing control information is processed.

In addition, the information included in the common information according to this embodiment is not limited to the environmental information according to this embodiment. For example, capability information indicating capability in the communication through the second communication channel (other communication channel) may be further included in the common information according to this embodiment. Here, an example of the capability information according to this embodiment is a parameter related to quality of service (QoS) of the second communication channel or data corresponding to a communication profile related to the communication through the second communication channel. In addition, an example of the above-described parameter related to QoS of the second communication channel is a parameter indicating a resolution/data size of an image transmittable in the second communication channel, a sampling cycle/data amount of sound data transmittable in the second communication channel, a file system format/data amount of data transmittable in the second communication channel, or a communication rate in the second communication channel, or the like.

An example of a process using the common information according to this embodiment in the communication device 200 (the communication device of the side at which the processing control information is processed) will be described later.

FIGS. 5A to 5D are explanatory diagrams illustrating another example of the processing control information according to this embodiment. FIG. 5A illustrates another example of the structure of the processing control information according to this embodiment. In addition, like FIG. 4B, FIG. 5B illustrates an example of a structure of an application ID that can be included in the processing control information according to this embodiment. Like FIG. 4C, FIG. 5C illustrates an example of a structure of a device ID that can be included in the processing control information according to this embodiment. In addition, FIG. 5D illustrates an example of a structure of the common information according to this embodiment. Here, in FIGS. 5A to 5D, as in FIGS. 4A to 4C, an example in which first identification information is the application ID and second identification information is the device ID is illustrated.

When FIG. 5A is compared to FIG. 4A, the processing control information related to the other example illustrated in FIG. 5A further includes the common information. Here, although an example in which the common information includes the environmental information and the capability information is illustrated in FIG. 5D among FIGS. 5A to 5D, the common information according to this embodiment is not limited to the example illustrated in FIG. 5D. For example, the capability information may not be included in the common information according to this embodiment.

In the process (information generation process) of the above-described (I), for example, the communication device 100 generates the processing control information as illustrated in FIGS. 4A to 4C or FIG. 5A to 5D. Also, needless to say, the processing control information generated by the communication device 100 in the process (information generation process) of the above-described (I) is not limited to the examples illustrated in FIGS. 4A to 5D.

(II) Transmission Control Process

When the processing control information is generated in the process (information generation process) of the above-described (I), the communication device 100 causes the generated processing control information to be transmitted through the first communication channel.

The communication device 100, for example, causes a communication unit to transmit the processing control information by transferring the generated processing control information and the transmission command to the communication unit (a first communication unit as will be described later), which communicates with the external device through the first communication channel (one communication channel). Also, the communication device 100, for example, may cause a communication device, which is communicable with the external device through the first communication channel and located outside the communication device 100, to transmit the processing control information.

The communication device 100 (the communication device of the side at which the processing control information is generated), for example, performs the process (information generation process) of the above-described (I) and the process (transmission control process) of the above-described (II) as the processes related to the generation of the processing control information. For example, the communication device 100 can generate the processing control information and transmit the generated processing control information through the first communication channel by performing the process (information generation process) of the above-described (I) and the process (transmission control process) of the above-described (II).

In addition, in the information processing system 1000, the communication device 200 (the communication device of the side at which the processing control information is processed) can more flexibly perform a process corresponding to the processing control information based on the acquired processing control information through the process related to the information processing method according to this embodiment.

Consequently, the communication device 100, for example, performs the process (information generation process) of the above-described (I) and the process (transmission control process) of the above-described (II) as the process related to the generation of the processing control information, and hence the information processing system in which a process corresponding to the processing control information can be more flexibly performed based on the acquired processing control information is implemented.

Figure 6:
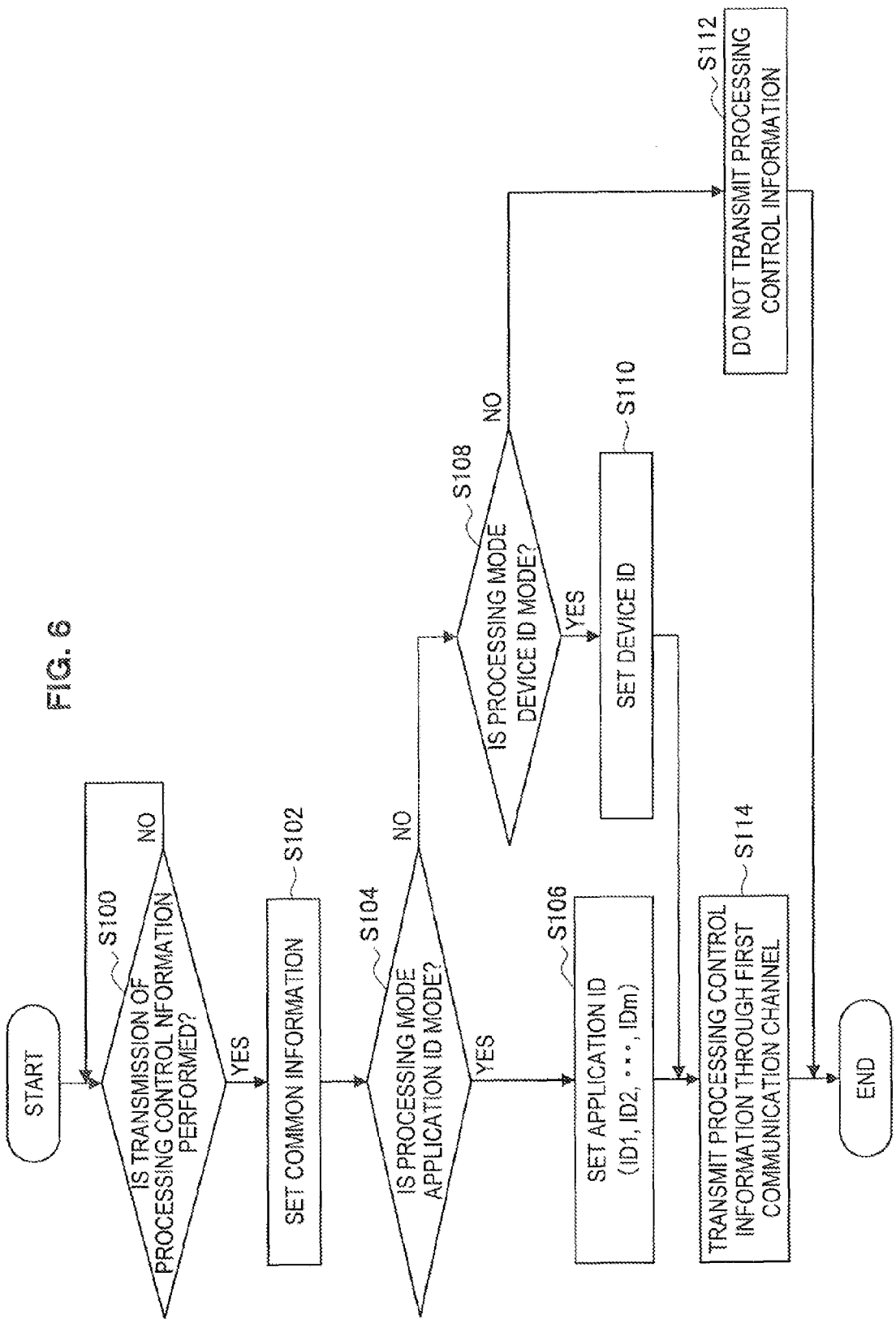
FIG. 6 is a flowchart illustrating an example of a process related to generation of the processing control information in a communication device according to this embodiment.

FIG. 6 is a flowchart illustrating an example of the process related to the generation of the processing control information in the communication device 100 according to this embodiment. Here, in FIG. 6, for example, the process of steps S102 to S110 corresponds to the process (information generation process) of the above-described (I). In addition, in FIG. 6, for example, the process of steps S112 and S114 corresponds to the process (transmission control process) of the above-described (II).

The communication device 100 determines whether to transmit the processing control information (S100). When an operation signal has been detected based on the user's operation, the communication device 100 determines to transmit the processing control information.

When the transmission of the processing control information is determined not to be performed in step S100, the communication device 100 does not perform a process until the transmission of the processing control information is determined to be performed.

In addition, when the transmission of the processing control information is determined to be performed in step S100, the communication device 100 sets the common information in the processing control information (S102). For example, when environmental information is set as the common information based on an establishment state of the second communication channel or the like and the second communication channel is established, the communication device 100 further sets the capability information corresponding to the established second communication channel as the common information.

In addition, when the transmission of the processing control information is determined to be performed in step S100, the communication device 100, for example, determines whether the processing mode to be executed by the communication device 200 is the application ID mode (corresponding to the above-described first processing mode) based on an operation signal based on the user's operation (S104). The process of step S104 corresponds to the determination of whether to generate the processing control information including the first identification information.

Here, for example, when an application is designated in the operation signal based on the user's operation, the communication device 100 determines that the processing mode is the application ID mode (that is, determines to generate the processing control information including the first identification information). In addition, when no application is designated in the operation signal based on the user's operation, the communication device 100 determines that the processing mode is not the application ID mode (that is, determines not to generate the processing control information including the first identification information).

When the processing mode is determined to be the application ID mode in step S104, the communication device 100, for example, sets the application ID in the processing control information based on the operation signal based on the user's operation (S106). In step S106, the communication device 100, for example, sets the "application ID designation number (m)" and the "application ID1" to the "application IDm" illustrated in FIG. 5 based on the number of applications designated in the operation signal based on the user's operation and contents of the applications.

In addition, when the processing mode is determined not to be the application ID mode in step S104, the communication device 100 determines whether the processing mode to be executed by the communication device 200 is the device ID mode (corresponding to the above-described second processing mode) (S108). The process of step S108 corresponds to a determination of whether to generate the processing control information including the second identification information.

Here, when a type (operation category) of device having a predetermined function, for example, is designated in an operation signal based on the user's operation, the communication device 100 determines that the processing mode is the device ID mode (that is, determines to generate the processing control information including the second identification information). In addition, when a type (operation category) of device having a predetermined function, for example, is not designated in the operation signal based on the user's operation, the communication device 100 determines that the processing mode is not the device ID mode (that is, determines not to generate the processing control information including the second identification information).

When the processing mode is determined to be the device ID mode in step S108, the communication device 100, for example, sets the device ID in the processing control information in the operation signal based on the user's operation (S110).

Also, although an example in which the process of steps S104 to S110 is performed after the process of step S102 has been performed is illustrated in FIG. 6, the communication device of the side at which the processing control information is generated according to this embodiment can independently perform the process of step S102 and the process of steps S104 to S110. Consequently, the communication device of the side at which the processing control information is generated according to this embodiment, for example, may perform the process of step S102 after the process of steps S104 to S110, or may perform the process of step S102 and the process of steps S104 to S110 in synchronization.

In addition, although an example in which the determination related to the process of step S108 is made after the determination related to the process of step S104 has been made is illustrated in FIG. 6, the communication device of the side at which the processing control information is generated according to this embodiment, for example, may make the determination related to the process of step S104 after the determination related to the process of step S108 has been made.

When the processing mode is determined not to be the device ID mode in step S108, the communication device 100 does not transmit the processing control information (S112). Accordingly, the communication device 100 ends the process related to the generation of the processing control information.

Also, when no processing control information is transmitted in step S112, the communication device 100 may provide the user with an error notification indicating that no processing control information is transmitted through a visual notification method using text, an image, or the like or an auditory notification method using a sound (music, a beep sound, or the like; this is assumed to be substantially the same hereinafter). An example of an object for providing the notification in the communication device 100 is a display unit (as will be described later) or a sound output unit (as will be described later) provided in its own device (the communication device 100) and/or an external device such as an external display device or an external sound output device.

When the process of step S106 or the process of step S110 is performed, the communication device 100 causes the processing control information to be transmitted through the first communication channel (S114). Accordingly, the communication device 100 ends the process related to the generation of the processing control information.

The communication device 100 (the communication device of the side at which the processing control information is generated), for example, performs the process illustrated in FIG. 6 as the process related to the generation of the processing control information. Through the process illustrated in FIG. 6, the process (information generation process) of the above-described (I) and the process (transmission control process) of the above-described (II) are implemented. Therefore, the communication device 100 (the communication device of the side at which the processing control information is generated), for example, performs the process illustrated in FIG. 6, and hence the information processing system capable of more flexibly performing the process corresponding to the processing control information based on the acquired processing control information is implemented.

Also, the process related to the generation of the processing control information in the communication device 100 (the communication device of the side at which the processing control information is generated) according to this embodiment is not limited to the process illustrated in FIG. 6.

For example, when a function of performing communication through the second communication channel is not provided, the communication device 100 may not perform the process of step S102 either.

Figure 5:
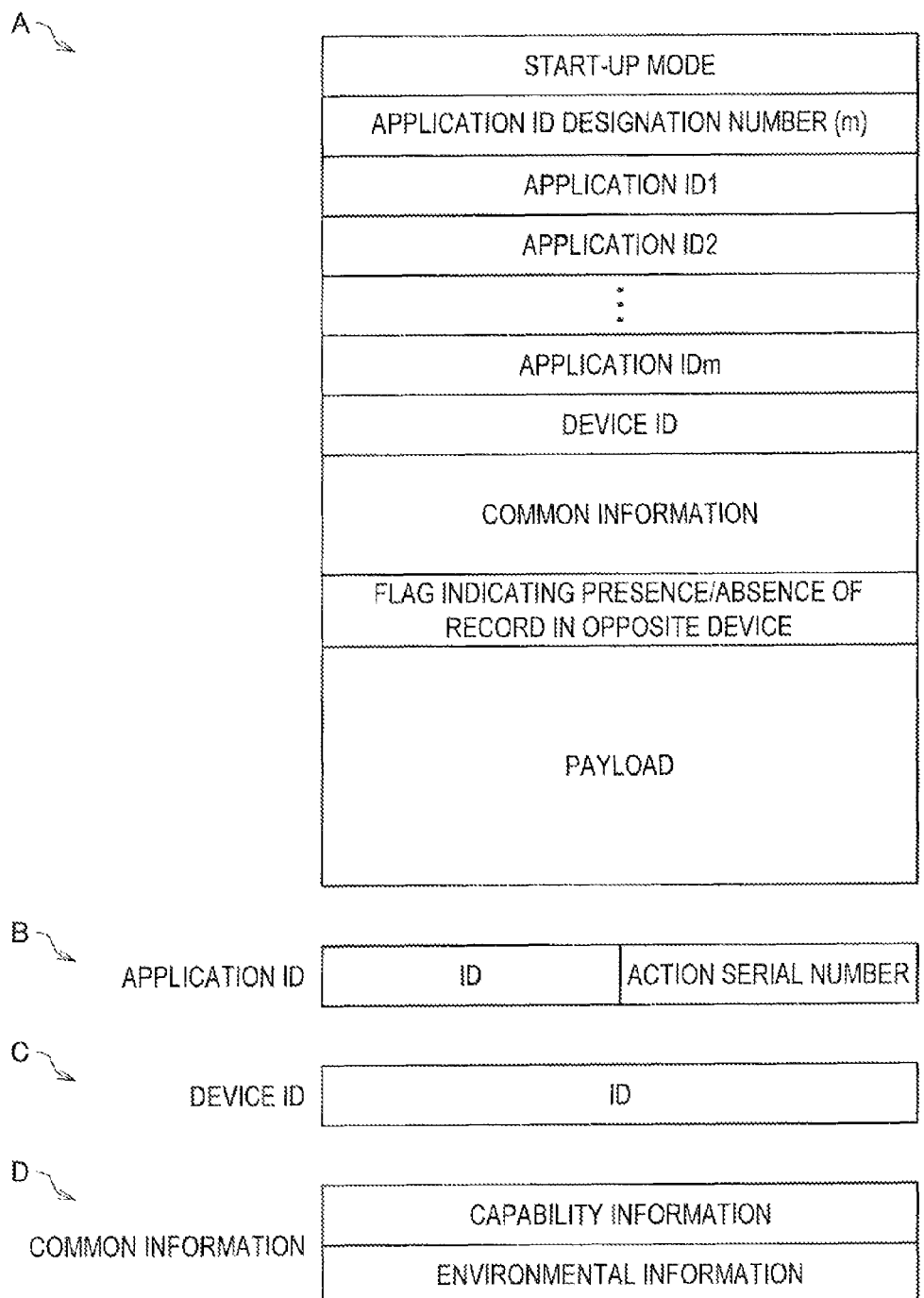
FIGS. 5A to 5D are explanatory diagrams illustrating another example of the processing control information according to this embodiment.

In addition, when the application ID has been set in the processing control information in step S106 or when the device ID has been set in the processing control information in step S110, the communication device 100, for example, may further set the "start-up mode" illustrated in FIG. 5 in the processing control information. For example, when the application ID has been set in the processing control information in step S106, the communication device 100, for example, sets a flag corresponding to the "start-up mode" illustrated in FIG. 5 to a value indicating that the application ID is included. In addition, for example, when the device ID has been set in the processing control information in step S110, the communication device 100, for example, sets the flag corresponding to the "start-up mode" illustrated in FIG. 5 to a value indicating that the device ID is included.

[3] Process Related to Information Processing Method in Communication Device 200 (Communication Device of Side at which Processing Control Information is Processed)

The communication device 200 determines the processing mode in which an application is executed based on the processing control information acquired through the first communication channel (one communication channel) (a determination process). Accordingly, the communication device 200 executes the application corresponding to the processing control information based on the determined processing mode (an execution process).

(1) Determination Process

The communication device 200 determines the processing mode based on the first or second identification information included in the acquired processing control information.

More specifically, the first processing mode in which the application corresponding to the first identification information is executed is determined as described with reference to FIG. 2. In addition, as described with reference to FIG. 3, when the second identification information is included in the processing control information, the communication device 200, for example, determines the second processing mode in which one or more applications corresponding to the second identification information are executed.

(2) Execution Process

When the processing mode is determined in the process of the above-described (1), the communication device 200 executes the application corresponding to the processing control information based on the determined processing mode.

More specifically, as described with reference to FIG. 2, when the first identification information is included in the processing control information and hence the first processing mode is determined, the communication device 200, for example, executes an application corresponding to the first identification information. In addition, as described with reference to FIG. 3, when the second identification information is included in the processing control information and hence the second processing mode is determined, the communication device 200, for example, specifies one or more applications corresponding to the second identification information and executes the specified applications.

Here, as described with reference to FIGS. 2 and 3, for example, when there is no application corresponding to the first identification information, when no application corresponding to the second identification information is specified, or when no specified application corresponding to the second identification information is executed, the communication device 200 does not perform the application corresponding to the acquired processing control information. Also, as described with reference to FIGS. 2 and 3, when no specified application corresponding to the first or second identification information is stored in the storage unit (as will be described later) or the like, the communication device 200, for example, can also acquire a specified application corresponding to the first or second identification information from the external device such as the server and execute the acquired application (the specified application corresponding to the first or second identification information).

The communication device 200 (the communication device of the side at which the processing control information is processed), for example, performs the process (determination process) of the above-described (1) and the process (execution process) of the above-described (2) as the process related to the information processing method according to this embodiment.

Here, when the first identification information directly indicating the application is included in the processing control information, the communication device 200 determines the first processing mode in the process (determination process) of the above-described (1). Accordingly, the communication device 200 performs a process to be implemented by an application corresponding to the first identification information, that is, a process to be implemented by an application directly designated in the processing control information, in the process (execution process) of the above-described (2).

In addition, when the second identification information indirectly indicating the application is included in the processing control information, the communication device 200 determines the second processing mode in the process (determination process) of the above-described (1). Accordingly, the communication device 200 performs a process to be implemented by one or more applications corresponding to the second identification information, that is, an application indirectly designated in the second identification information (an application for functioning as a device having a predetermined function corresponding to the second identification information), in the process (execution process) of the above-described (2).

Therefore, the communication device 200 (the communication device of the side at which the processing control information is processed) can more flexibly perform a process corresponding to the processing control information based on the acquired processing control information. In addition, because the communication device 200 (the communication device of the side at which the processing control information is processed) can more flexibly perform the process corresponding to the processing control information, it is possible to deal with various services.

Also, the process (execution process) of the above-described (2) in the communication device 200 (the communication device of the side at which the processing control information is processed) is not limited to the above.

For example, as illustrated in FIG. 5, common information related to communication through the second communication channel (the other communication channel) can be further included in the processing control information according to this embodiment. When the common information is included in the processing control information acquired through the first communication channel, the communication device 200 may selectively establish communication through the second communication channel (other communication channel) with an external device, which has performed communication through the first communication channel, such as the communication device 100 based on the common information.

(2-1) First Example of Process Based on Common Information

When environmental information included in the common information indicates that the second communication channel (other communication channel) is not established, the communication device 200 establishes communication through the second communication channel with the above-described external device. The communication device 200, for example, establishes the communication through the second communication channel with the above-described external device using connection information included in the environmental information.

In addition, when the environmental information included in the common information indicates that the second communication channel (other communication channel) is established, the communication device 200, for example, does not newly establish communication through the second communication channel with the above-described external device. For example, in a state in which wireless communication (an example of communication through the second communication channel) using a wireless LAN such as IEEE 802.11b (Wi-Fi) is already possible, the communication device 200 does not perform a process for establishing communication through the new second communication channel.

Here, for example, when it is not particularly necessary to establish communication through the second communication channel upon execution of an application such as when an application corresponding to the processing control information to be executed based on the processing mode determined in the process of the above-described (1) is not an application using a communication function, the communication device 200, for example, does not establish communication through the second communication channel with the above-described external device. The communication device 200 determines whether to perform a process related to establishment of the communication through the second communication channel based on a type or function of an application corresponding to the processing control information. Also, needless to say, the communication device 200 can perform a process related to the establishment of the communication through the second communication channel, regardless of the type or function of the application corresponding to the processing control information.

In addition, when the communication device 200 does not have a function of performing the communication through the second communication channel such as when the communication device 200 performs communication with the external device through the second communication channel different from the first communication channel (one communication channel) and does not have one or more communication units (second communication units as will be described later), the communication device 200 may not perform the process based on the common information. Also, when the communication device 200 does not have the function of performing the communication through the second communication channel, the communication device 200 can perform the process based on the common information. However, even when the communication device 200 has performed the process based on the common information, the communication through the second communication channel with the above-described external device is not established.

(2-2) Second Example of Process Based on Common Information

When capability information is further included in the common information, the communication device 200, for example, determines whether to establish another new communication channel based on the capability information if the environmental information indicates that the second communication channel (other communication channel) is established. Accordingly, when the other new communication channel is determined to be established, the communication device 200 establishes communication through the new second communication channel (other communication channel).

For example, the communication device 200 determines whether a communication profile corresponding to the established second communication channel included in the capability information is consistent with a communication profile in its own device (the communication device 200).

When the communication profiles are determined to be consistent in the above-described determination, the communication device 200 does not establish the other new communication channel. In the above-described case, for example, even when the communication device 200 and the communication device 100 have a function of performing wireless communication using IEEE 802.15.1 in a state in which wireless communication using a wireless LAN such as IEEE 802.11b (Wi-Fi) (an example of communication through the second communication channel) between the communication device 200 and the communication device 100 is already possible, the wireless communication using IEEE 802.15.1 is not newly established.

In addition, when the communication profiles are determined not to be consistent in the above-described determination, the communication device 200 establishes the other new communication channel as in the process related to the first example shown in the above-described (2-1). In the above-described case, for example, when the communication device 200 and the communication device 100 have a function of performing wireless communication using IEEE 802.15.1 in a state in which wireless communication (an example of communication through the second communication channel) using a wireless LAN such as IEEE 802.11b (Wi-Fi) between the communication device 200 and the communication device 100 is already possible, the wireless communication using IEEE 802.15.1 is newly established.

In addition, the communication device 200, for example, may determine whether the communication through the established second communication channel satisfies the requirement of an application corresponding to the processing control information to be executed based on a QoS-related parameter corresponding to the established second communication channel included in the capability information. For example, the communication device 200 determines whether the communication rate necessary for the application corresponding to the processing control information to be executed based on the processing mode determined in the process of the above-described (1) exceeds the communication rate indicated by the QoS-related parameter corresponding to the established second communication channel included in the capability information.

When the communication through the established second communication channel satisfies the requirement of the application corresponding to the processing control information to be executed, the communication device 200, for example, does not establish the other new communication channel. In addition, when the communication through the established second communication channel does not satisfy the requirement of the application corresponding to the processing control information to be executed, the communication device 200 establishes the other new communication channel as in the process related to the first example illustrated in the above-described (2-1).

For example, the communication device 200 (the communication device of the side at which the processing control information is processed) can selectively establish the communication through the second communication channel (other communication channel) with the external device, which has performed communication through the first communication channel, such as the communication device 100 based on the common information by performing the process related to the first example shown in the above-described (2-1) or the process related to the second example shown in the above-described (2-2).

Therefore, the communication device 200 (the communication device of the side at which the processing control information is processed) can more flexibly perform the process corresponding to the acquired processing control information.

Figure 7:
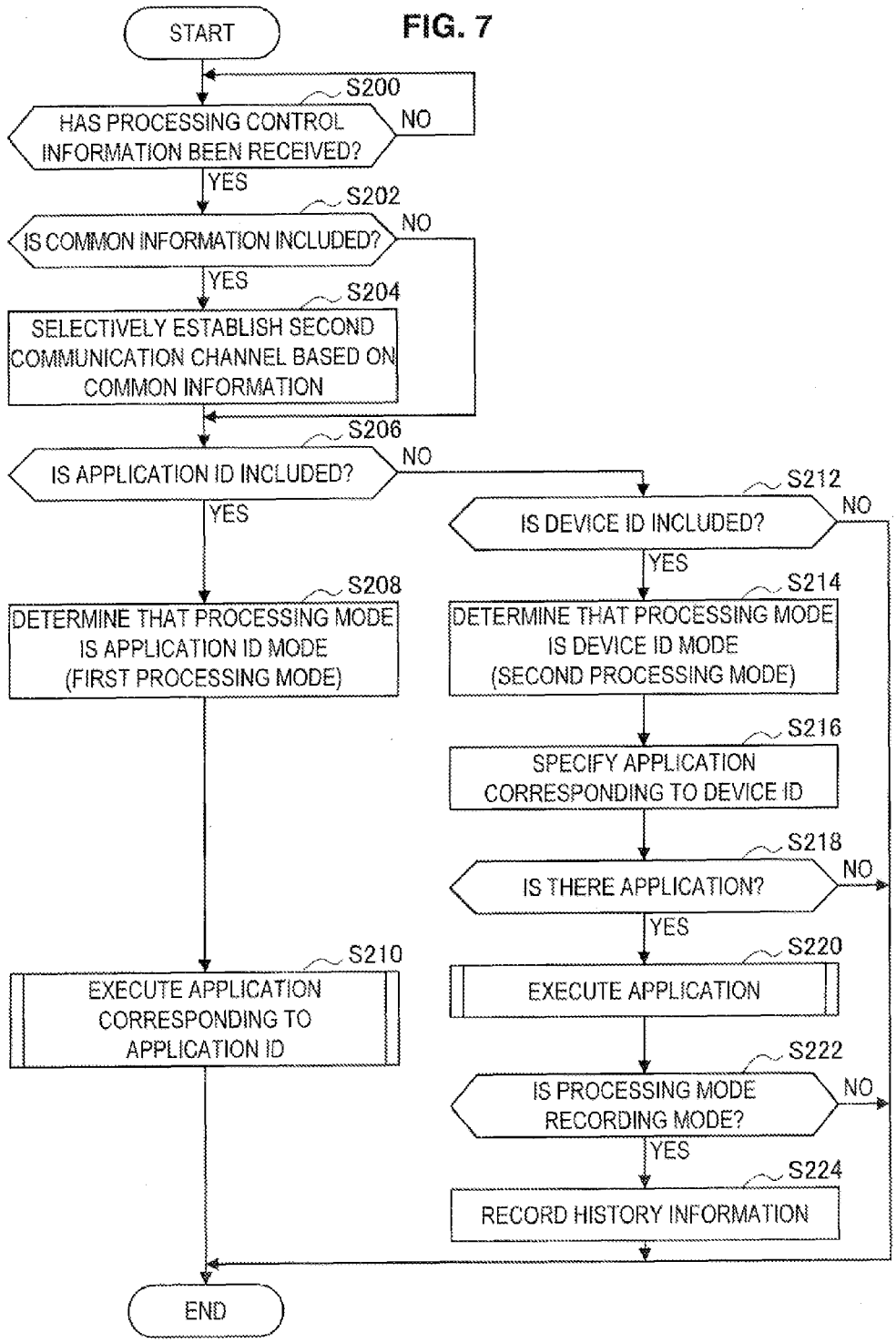
FIG. 7 is a flowchart illustrating an example of a process related to the information processing method according to this embodiment in the communication device according to this embodiment.

FIG. 7 is a flowchart illustrating an example of the process related to the information processing method according to this embodiment in the communication device 200 according to this embodiment. Here, in FIG. 7, for example, the process of steps S206, S208, and S212 to S218 corresponds to the process (determination process) of the above-described (1). In addition, in FIG. 7, for example, the process of steps S202, S204, S210, and S220 corresponds to the process (execution process) of the above-described (2). In addition, in FIG. 7, the example in which the first identification information is the application ID and the second identification information is the device ID is illustrated.

The communication device 200 determines whether the processing control information has been received through the first communication channel (S200). When the processing control information is determined not to have been received in step S200, the communication device 200 does not perform the process until the processing control information is determined to have been received.

When the processing control information is determined to have been received in step S200, the communication device 200 determines whether common information is included in the processing control information (S202). When the common information is determined not to be included in the processing control information in step S202, the communication device 200 performs the process from step S206 as will be described later.

When the common information is determined to be included in the processing control information in step S202, the communication device 200 selectively establishes a second communication channel based on common information (S204). The communication device 200 selectively establishes the second communication channel by performing the process related to the first example shown in the above-described (2-1) or the process related to the second example shown in the above-described (2-2).

When the common information is determined not to be included in the processing control information in step S202 or when the process of step S204 has been performed, the communication device 200 determines whether an application ID (first identification information) is included in the processing control information (S206). Here, for example, when the application ID designation number (m) and the "application ID1" to the "application IDm" illustrated in FIG. 4A or 5A are set in the received processing control information, the communication device 200, for example, determines that the application ID (first identification information) is included in the processing control information.

Also, the process of step S206 is not limited to the above. For example, when a flag corresponding to the "start-up mode" (an example of the "start-up mode") illustrated in FIG. 4A or 5A is included in the received processing control information, the communication device 200 may determine whether the application ID (first identification information) is included in the processing control information based on a value of the flag corresponding to the "start-up mode" included in the processing control information. More specifically, for example, when the value of the flag corresponding to the "start-up mode" illustrated in FIG. 4A or 5A is a value indicating that the application ID is included, the communication device 200 determines that the application ID (first identification information) is included in the processing control information. In addition, for example, when the value of the flag corresponding to the "start-up mode" illustrated in FIG. 4A or 5A is not the value indicating that the application ID is included, the communication device 200 determines that the application ID (first identification information) is not included in the processing control information.

When the application ID (first identification information) is determined to be included in step S206, the communication device 200 determines that the processing mode is the application ID mode (first processing mode) (S208).

When the processing mode is determined to be the application ID mode (first processing mode) in step S208, the communication device 200 executes an application corresponding to the application ID included in the processing control information (S210). Therefore, the communication device 200 ends the process related to the information processing method according to this embodiment.

Here, when a plurality of application IDs are included in the processing control information, the communication device 200, for example, executes applications corresponding to the application IDs included in the processing control information in sequence or parallel.

Figure 8:
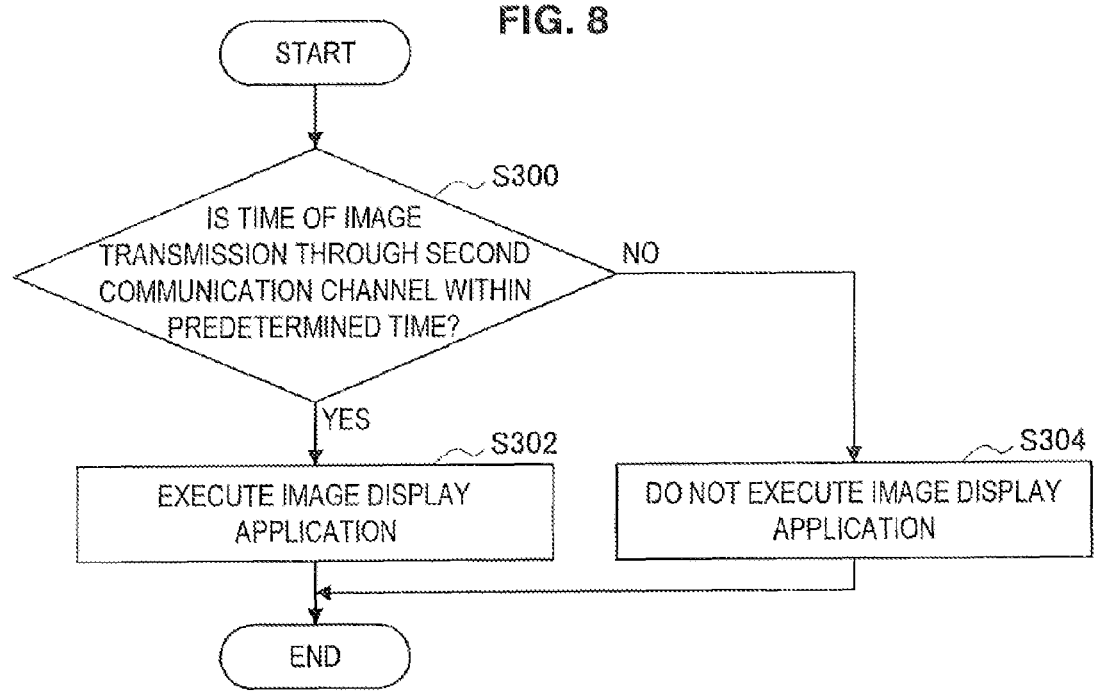
FIG. 8 is a flowchart illustrating an example of a process related to the information processing method according to this embodiment in the communication device according to this embodiment.

FIG. 8 is a flowchart illustrating an example of the process related to the information processing method according to this embodiment in the communication device 200 according to this embodiment, and illustrates an example of the application execution process illustrated in step S210 of FIG. 7. Here, FIG. 8 illustrates an example of the application execution process when the application corresponding to the application ID is an image display application for causing an image acquired using the communication through the second communication channel to be displayed on a display screen.

The communication device 200 determines whether a time of image transmission through the second communication channel is within a predetermined time (S300). Here, the communication device 200, for example, determines whether the time of image transmission through the established second communication channel satisfies the requirement of the image display application based on the QoS-related parameter corresponding to the established second communication channel in the capability information included in the processing control information. For example, when the time of image transmission through the established second communication channel is determined to satisfy the requirement of the image display application, the communication device 200 determines that the time of image transmission through the second communication channel is within the predetermined time. In addition, for example, when the time of image transmission through the established second communication channel is determined not to satisfy the requirement of the image display application, the communication device 200 determines that the time of image transmission through the second communication channel is not within the predetermined time.

When the time of image transmission through the second communication channel is determined to be within the predetermined time in step S300, the communication device 200 executes the image display application (S302). The process of step S302 is performed, so that, for example, an image transmitted from the external device such as the communication device 100 through the second communication channel is displayed on the display screen.

In addition, when the time of image transmission through the second communication channel is determined not to be within the predetermined time in step S300, the communication device 200 does not execute the image display application (S304). In the above-described case, no image is transmitted from the external device such as the communication device 100 through the second communication channel. Even when the image is transmitted, the image transmitted from the external device through the second communication channel is not displayed on the display screen.

Also, when no image display application is executed in step S304, the communication device 200, for example, may provide the user with an error notification indicating that the application corresponding to the application ID is not executed through a visual notification method using text, an image, or the like or an auditory notification method using a sound. An example of an object for providing the notification in the communication device 200 is a display unit (as will be described later) or a sound output unit (as will be described later) provided in its own device (the communication device 200) and/or an external device such as an external display device or an external sound output device.

In step S210 of FIG. 7, for example, the process as illustrated in FIG. 8 is performed, and hence the application corresponding to the application ID included in the processing control information is selectively executed.

When the process illustrated in FIG. 8 is performed in step S210 of FIG. 7, the communication device 200 selectively executes an image display application based on the result of the determination of whether the time of image data transmission through the second communication channel in step S300 is proper. That is, for example, when the process illustrated in FIG. 8 is performed in step S210 of FIG. 7, the communication device 200, for example, executes the image display application under the assumption that the time of image data transmission through the second communication channel is proper.

Also, a process of executing the application illustrated in step S210 of FIG. 7 is not limited to the image display application illustrated in FIG. 8. For example, the communication device 200 can perform various processes such as a tethering application as will be described later for the number of application IDs included in the processing control information.

An example of a process related to the information processing method according to this embodiment will be described with reference back to FIG. 7. When the application ID (first identification information) is determined not to be included in step S206, the communication device 200 determines whether the device ID (second identification information) is included in the processing control information (S212). Here, the communication device 200, for example, determines that the device ID (second identification information) is included in the processing control information when the "device ID" illustrated in FIG. 4A or 5A is set in the received processing control information.

Also, the process of step S212 is not limited to the above. For example, when a flag corresponding to the "start-up mode" (an example of the "start-up mode") illustrated in FIG. 4A or 5A is included in the received processing control information," the communication device 200 may determine whether the device ID (second identification information) is included in the processing control information based on the value of the flag corresponding to the "start-up mode" included in the processing control information. More specifically, for example, when the value of the flag corresponding to the "start-up mode" illustrated in FIG. 4A or 5A is a value indicating that the device ID is included, the communication device 200 determines that the device ID (second identification information) is included in the processing control information. In addition, for example, when the value of the flag corresponding to the "start-up mode" illustrated in FIG. 4A or 5A is not the value indicating that the device ID is included, the communication device 200 determines that the device ID (second identification information) is not included in the processing control information.

When the device ID (second identification information) is determined not to be included in the processing control information in step S212, the communication device 200 ends the process related to the information processing method according to this embodiment. Also, when the device ID (second identification information) is determined not to be included in the processing control information in step S212, the communication device 200, for example, may notify the user of an error indicating that the application is not executed through a visual notification method using text, an image, or the like or an auditory notification method using a sound.

When the device ID (second identification information) is determined to be included in the processing control information in step S212, the communication device 200 determines that the processing mode is the device ID mode (second processing mode) (S214).

When the processing mode is determined to be the device ID mode (second processing mode) in step S214, the communication device 200 specifies the application corresponding to the device ID (second identification information) (S216). For example, as illustrated with reference to FIG. 3, the communication device 200 specifies a type (operation category) of device having a predetermined function corresponding to the device ID (second identification information), and specifies one or more applications for executing a function indicated by the specified type (operation category) of device having the predetermined function corresponding to the device ID.

When the application corresponding to the device ID (second identification information) is specified in step S216, the communication device 200 determines whether the specified application is present (S218). For example, when the specified application is stored in the storage unit (as will be described later) or the like, the communication device 200 determines that the specified application is present.

When the specified application is determined not to be present in step S218, the communication device 200 ends the process related to the information processing method according to this embodiment. Also, when the specified application is determined not to be present in step S218, the communication device 200, for example, may notify the user of an error indicating that the application is not executed through a visual notification method using text, an image, or the like or an auditory notification method using a sound.

When the specified application is determined to be present in step S218, the communication device 200 executes the application specified in step S216 (S220). Here, when there are a plurality of specified applications in step S216, the communication device 200, for example, executes the specified applications in sequence or parallel.

Figure 9:
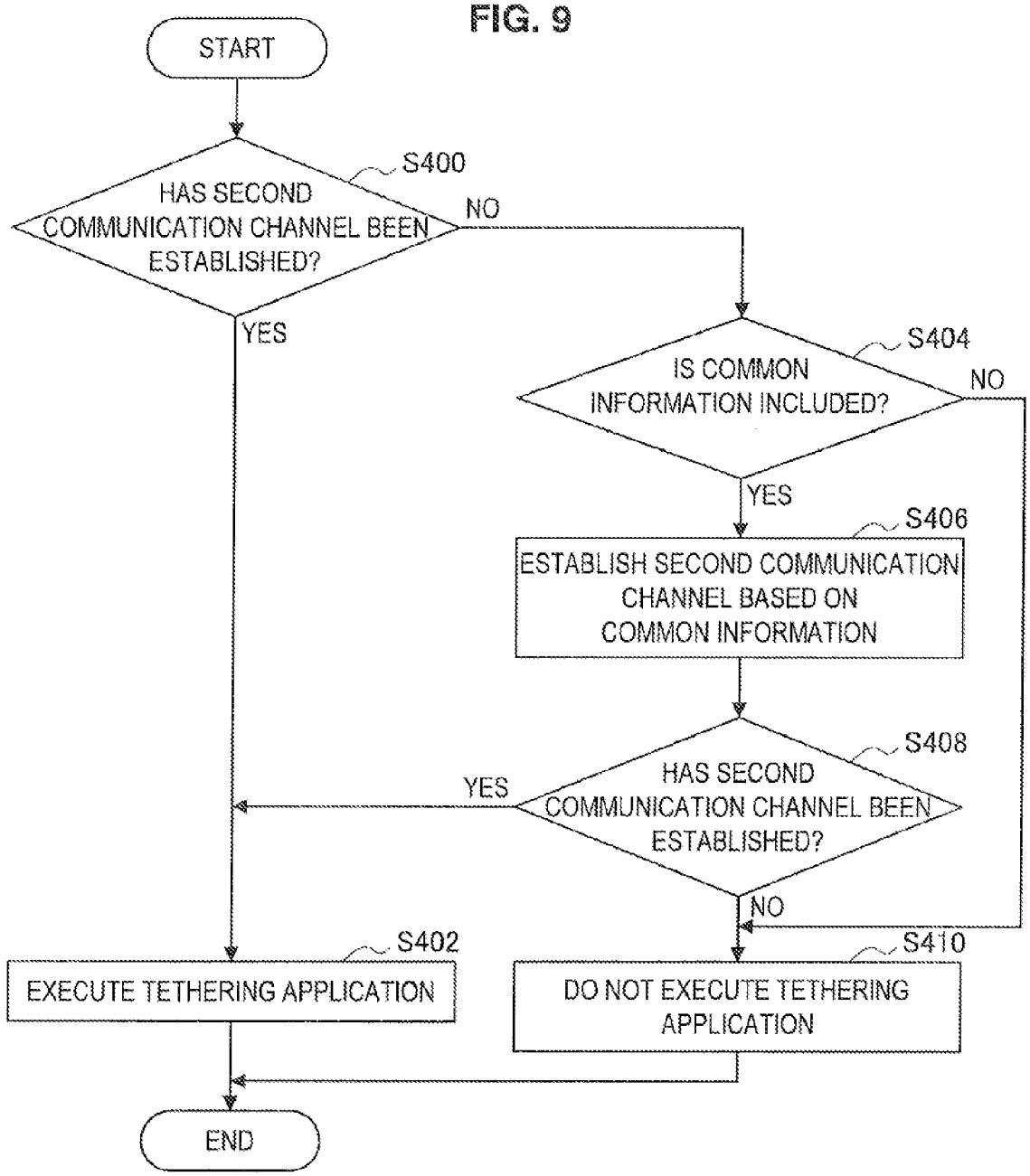
FIG. 9 is a flowchart illustrating an example of a process related to the information processing method according to this embodiment in the communication device according to this embodiment.

FIG. 9 is a flowchart illustrating an example of a process related to the information processing method according to this embodiment in the communication device 200 according to this embodiment, and illustrates an example of the application execution process illustrated in step S220 of FIG. 7. Here, FIG. 8 illustrates an example of the application execution process when the application specified in step S216 is a tethering application in which tethering is performed using the communication through the second communication channel.

The communication device 200 determines whether the second communication channel is established (S400).

When the second communication channel is determined to be established in step S400, the communication device 200 executes the tethering application (S402). The process of step S402 is performed, and hence the tethering using the second communication channel is implemented.

In addition, when the second communication channel is determined not to be established in step S400, the communication device 200 determines whether common information is included in processing control information (S404).

When the common information is determined not to be included in the processing control information in step S404, the communication device 200 does not execute the tethering application (S410). In the above-described case, the tethering using the second communication channel is not implemented. Also, when the common information is determined not to be included in the processing control information in step S404, the communication device 200, for example, may notify the user of an error indicating that the application is not executed through a visual notification method using text, an image, or the like or an auditory notification method using a sound.

When the common information is determined to be included in the processing control information in step S404, the communication device 200 establishes the second communication channel based on the common information (S406). The communication device 200, for example, establishes the communication through the second communication channel with the external device using connection information included in environmental information.

When the process of step S406 is performed, the communication device 200 determines whether the second communication channel has been established (S408).

When the second communication channel is determined to have been established in step S408, the communication device 200 executes the tethering application (S402). In addition, when the second communication channel is determined not to have been established in step S408, the communication device 200 does not execute the tethering application (S410).

In step S220 of FIG. 7, for example, the process as illustrated in FIG. 9 is performed, and hence the application specified in step S216 is selectively executed.

In step S210 of FIG. 7, if the process illustrated in FIG. 9 is performed, the communication device 200, for example, executes the tethering application when the tethering application using the communication through the second communication channel formed by wireless communication according to IEEE 802.11b (Wi-Fi) or the like is prescribed as an application corresponding to an operation category corresponding to the device ID and the second communication channel has been established.

Also, the application execution process illustrated in step S220 of FIG. 7 is not limited to the tethering application illustrated in FIG. 9. For example, the communication device 200 can perform various processes such as the image display application illustrated in FIG. 8 for the number of applications specified in step S216.

An example of the process related to the information processing method according to this embodiment will be described with reference back to FIG. 7. When the process of step S220 is performed, the communication device 200 determines whether the processing mode is a recording mode in which history information is recorded (S222). For example, the communication device 200 determines that the processing mode is the recording mode when the "flag indicating the presence/absence of the record in the opposite device" illustrated in FIG. 4A or 5A indicates that the history information is recorded, and determines that the processing mode is not the recording mode when the "flag indicating the presence/absence of the record in the opposite device" does not indicate that the history information is recorded.

When the processing mode is determined not to be the recording mode in step S222, the communication device 200 ends the process related to the information processing method according to this embodiment.

In addition, when the processing mode is determined to be the recording mode in step S222, the communication device 200 records the history information in the storage unit (as will be described later), the external recording medium, or the like (S224). Therefore, the communication device 200 ends the process related to the information processing method according to this embodiment.

Here, an example of the process of step S224 is a process of accumulating the number of operations of the communication device 200 for each type (operation category) of device having a predetermined function corresponding to the device ID (second identification information) and recording the result of the accumulation process as history information. By recording the above-described history information, for example, a service provider or the like can collect an operation history or the number of operations for each operation category and use the collected operation history and the collected number of operations for improvement in service or recommendation for the user in the future.

The communication device 200 (the communication device of the side at which the processing control information is processed), for example, performs the process illustrated in FIG. 7 as the process related to the information processing method according to this embodiment. Through the process illustrated in FIG. 7, the process (determination process) of the above-described (1) and the process (execution process) of the above-described (2) are implemented. Therefore, the communication device 200 (the communication device of the side at which the processing control information is processed), for example, can more flexibly perform the process corresponding to the processing control information based on the acquired processing control information by performing the process illustrated in FIG. 7.

Also, the process related to the information processing method according to this embodiment in the communication device 200 (the communication device of the side at which the processing control information is processed) is not limited to the process illustrated in FIG. 7. For example, when a function of performing the communication through the second communication channel is not provided, the communication device 200 may not perform the process of steps S202 and S204 either. In addition, the communication device 200, for example, may not perform the process of steps S222 and S224.

(Communication Devices According to this Embodiment)

Next, examples of configurations of a communication device according to this embodiment capable of performing a process related to generation of processing control information according to this embodiment described above and a communication device according to this embodiment capable of performing a process related to the information processing method according to this embodiment described above will be described.

[I] Example of Configuration of Communication Device of Side at which Processing Control Information is Generated (Communication Device Configured to Perform Process Related to Generation of Processing Control Information According to this Embodiment)

Figure 10:
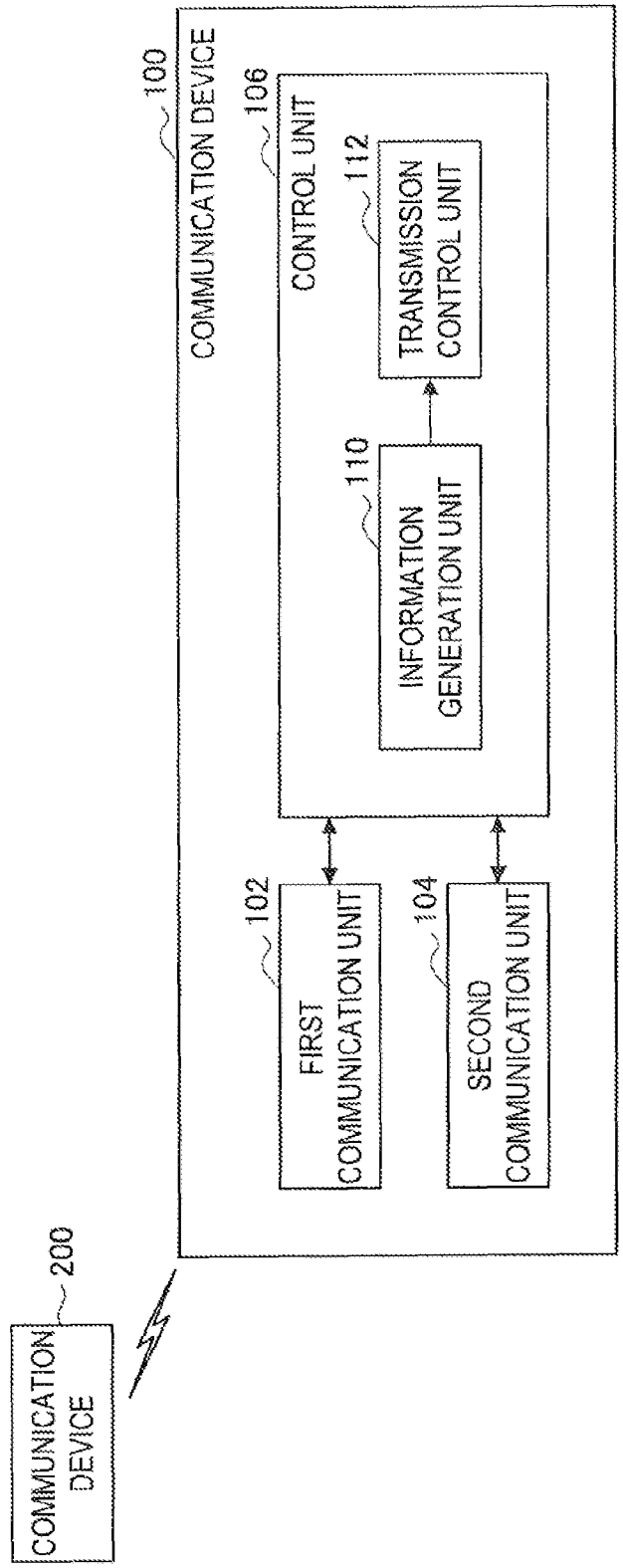
FIG. 10 is a block diagram illustrating an example of a configuration of a communication device of the side at which the processing control information is generated according to this embodiment.

FIG. 10 is a block diagram illustrating an example of a configuration of the communication device 100 of the side at which the processing control information is generated according to this embodiment. Here, in FIG. 10, the communication device 200 of the side at which the processing control information is processed according to this embodiment is also illustrated.

The communication device 100 includes a first communication unit (communication unit) 102, a second communication unit 104, and a control unit 106.

The communication device 100, for example, may include a read only memory (ROM) (not illustrated) or a random access memory (RAM) (not illustrated), a storage unit (not illustrated), an operating unit (not illustrated) capable of being operated by the user, a display unit (not illustrated) that displays various screens on a display screen, and the like. The communication device 100, for example, establishes a connection between the above-described components by a bus as a transmission channel for data.

Here, the ROM (not illustrated) stores programs to be used by the control unit 106 and control data such as arithmetic parameters. The RAM (not illustrated) temporarily stores programs and the like to be executed by the control unit 106.

The storage unit (not illustrated) is a storage means included in the communication device 100, and, for example, stores various data such as data constituting a user interface (UI) or an application. Here, an example of the storage unit (not illustrated) may be a magnetic recording medium such as a hard disk, a nonvolatile memory such as an electrically erasable programmable read-only memory (EEPROM) or a flash memory, or the like. In addition, the storage unit (not illustrated) may be detachable from the communication device 100.

In addition, the operation unit (not illustrated) may be an operation input device as will be described later, and the display unit (not illustrated) may be a display device as will be described later.

[Hardware Configuration Example of Communication Device 100]

Figure 11:
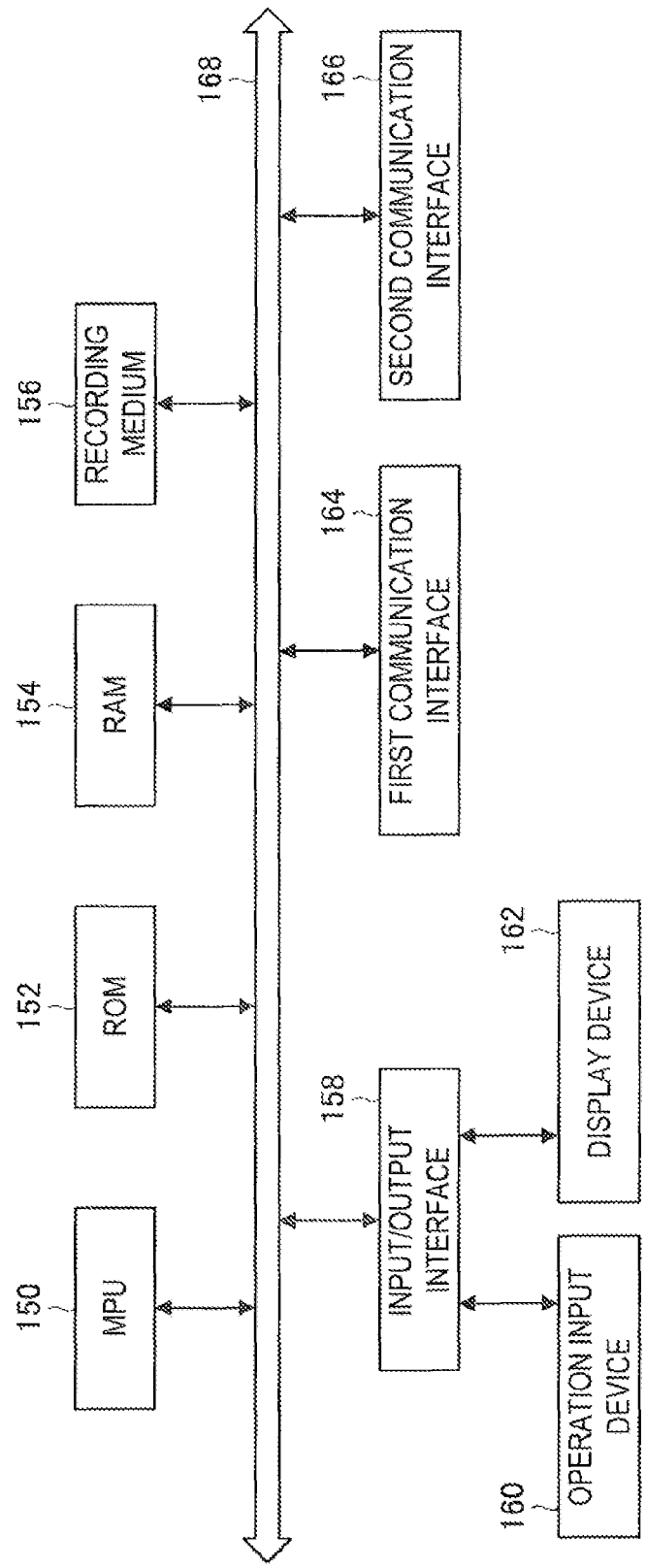
FIG. 11 is an explanatory diagram illustrating an example of a hardware configuration of the communication device according to this embodiment.

FIG. 11 is an explanatory diagram illustrating the example of the hardware configuration of the communication device 100 according to this embodiment. The communication device 100, for example, includes a micro processing unit (MPU) 150, a ROM 152, a RAM 154, a recording medium 156, an input/output interface 158, an operation input device 160, a display device 162, a first communication interface 164, and a second communication interface 166. In addition, the communication device 100, for example, establishes a connection between the above-described components by a bus 168 serving as a transmission channel for data.

The MPU 150 functions as the control unit 106 configured to include an MPU, various processing circuits, or the like and control the entire communication device 100. In addition, the MPU 150, for example, functions as an information generation unit 110 and a transmission control unit 112 as will be described later in the communication device 100.

The ROM 152 stores programs to be used by the MPU 150 and control data such as arithmetic parameters, and the RAM 154 temporarily stores programs and the like to be executed by the MPU 150.

The recording medium 156 functions as the storage unit (not illustrated), and, for example, stores various data such as data constituting a UI and an application. Here, an example of the recording medium 156 is a magnetic recording medium such as a hard disk or a nonvolatile memory such as a flash memory. In addition, the recording medium 156 may be detachable from the communication device 100.

The input/output interface 158 is connected to, for example, the operation input device 160 or the display device 162. The operation input device 160 functions as an operation unit (not illustrated), and the display device 162 functions as a display unit (not illustrated). Here, an example of the input/output interface 158 may be a universal serial bus (USB) terminal, a digital visual interface (DVI) terminal, a high-definition multimedia interface (HDMI) terminal, various processing circuits, or the like. The operation input device 160, for example, is provided on the communication device 100, and is connected to the input/output interface 158 inside the communication device 100. An example of the operation input device 160 may be a button, a direction key, a rotary selector such as a jog dial, or a combination thereof. In addition, the display device 162, for example, is provided on the communication device 100, and is connected to the input/output interface 158 inside the communication device 100. An example of the display device 162 is an LCD or an organic electro luminescence display. Alternatively, an example of the display device 162 is an organic light emitting diode display (OLED).

Needless to say, the input/output interface 158 can be connected to an operation input device (for example, a keyboard, a mouse, or the like), a display device, or various communication devices having a function of performing communication through the first or second communication channel as an external device of the communication device 100. In addition, needless to say, the display device 162, for example, may be a device on which a display and the user's operation are possible such as a touch screen.

The first communication interface 164 is a first communication means provided in the communication device 100, and functions as the first communication unit 102 configured to perform communication with the external device such as the communication device 200 via the first communication channel.

Here, an example of the first communication interface 164 is an NFC interface having a wireless communication antenna circuit and a carrier transmission circuit.

The wireless communication antenna circuit constituting the first communication interface 164 functions to form the first communication channel with the external device. The wireless communication antenna circuit, for example, includes a resonant circuit, which includes a coil having predetermined inductance serving as a transmission/reception antenna and a capacitor having predetermined electrostatic capacitance, and a demodulation circuit. Therefore, the wireless communication antenna circuit, for example, demodulates data or the like transmitted from the external device by receiving a magnetic field (carrier) of 13.56 MHz.

In addition, a carrier transmission circuit constituting the first communication interface 164, for example, includes a modulation circuit configured to perform modulation such as amplitude shift keying (ASK) and an amplification circuit configured to amplify an output of the modulation circuit, and transmits a carrier carrying a carrier signal from the transmission/reception antenna of the wireless communication antenna circuit. For example, the communication device 100 can have an initiator function in NFC and function as a so-called reader/writer by including the carrier transmission circuit. Here, an example of a carrier signal transmitted by the carrier transmission circuit from the wireless communication antenna circuit is a signal indicating processing control information or the like. In addition, the carrier transmission of the carrier transmission circuit, for example, is controlled by the MPU 150.

Also, the first communication interface 164 is not limited to an NFC interface including the above-described wireless communication antenna circuit and carrier transmission circuit. For example, the first communication interface 164 may include an integrated circuit (IC) chip configured to be driven by obtaining power from the received carrier and transmit a signal through additional modulation. For example, by including the above-described IC chip, the communication device 100 has a target function (a so-called card function) in NFC, and can function as a responder. Also, needless to say, when the communication device 100 has the target function in NFC, the hardware may not be the form of the above-described IC chip.

The first communication interface 164, for example, includes the NFC interface including the above-described wireless communication antenna circuit and carrier transmission circuit or the above-described IC chip, and functions as the first communication unit 102 forming the first communication channel.

Also, the first communication interface 164 is not limited to the above-described NFC interface or the above-described IC chip. For example, when the first communication channel is formed through infrared communication, the communication device 100 includes an infrared communication interface including an infrared port, a transmission/reception circuit, and the like as the first communication interface 164.

The second communication interface 166 is a second communication means provided in the communication device 100, and functions as the second communication unit 104 configured to communicate with the communication device 200 or the external device such as the server via the second communication channel. Here, an example of the second communication interface 166 is a set of an IEEE 802.15.1 port and a transmission/reception circuit or a set of an IEEE 802.11b port and a transmission/reception circuit.

For example, through the configuration illustrated in FIG. 11, the communication device 100 performs a process related to generation of the processing control information according to this embodiment. Also, the hardware configuration of the communication device 100 according to this embodiment is not limited to the configuration illustrated in FIG. 11.

For example, the communication device 100 according to this embodiment may include the second communication interface 166. Even when the communication device 100 does not include the second communication interface 166, the communication device 100 can transmit the generated processing control information to the external device using communication through the first communication channel.

In addition, the communication device 100 according to this embodiment, for example, may include a plurality of second communication interfaces 166 corresponding to different communication schemes.

In addition, for example, when the communication device 100 is configured to perform communication through the first communication channel or communication through the second communication channel using a connected external communication device, the communication device 100, for example, may not include the first communication interface 164 and/or the second communication interface 166.

The communication device 100, for example, may further include a digital signal processor (DSP) and a sound output device. An example of the sound output device according to this embodiment is an amplifier (amp), a speaker, and the like. When the DSP and the sound output device are further included, the communication device 100 can provide various notifications such as an error notification indicating that no processing control information is transmitted through a sound output from the sound output device.

In addition, the communication device 100, for example, can be configured without the operation input device 160 or the display device 162.

An example of the configuration of the communication device 100 will be described with reference back to FIG. 10. The first communication unit 102 functions to communicate with the external device such as the communication device 200 via the first communication channel (one communication channel). Here, an example of the first communication unit 102 is a communication device corresponding to a communication scheme forming the first communication channel such as an NFC interface, an IC chip related to communication by NFC, an infrared communication interface, or the like.

The second communication unit 104 functions to communicate with the external device such as the communication device 200 via the second communication channel (other communication channel). Here, an example of the second communication unit 104 is a communication device corresponding to a communication scheme forming the second communication channel such as a set of an IEEE 802.15.1 port and a transmission/reception circuit or a set of an IEEE 802.11b port and a transmission/reception circuit.

The control unit 106 includes an MPU, various processing circuits, or the like and functions to control the entire communication device 100. In addition, the control unit 106, for example, includes an information generation unit 110 and a transmission control unit 112, and functions to initiatively perform a process related to generation of processing control information according to this embodiment.

The information generation unit 110 functions to initiatively perform the process (information generation process) of the above-described (I), and generates processing control information including first identification information or processing control information including second identification information. The information generation unit 110, for example, generates processing control information based on an operation signal corresponding to the user's operation transmitted from the operation unit (not illustrated) or a transmission command of the processing control information received by the second communication unit 104.

The transmission control unit 112 functions to initiatively perform the process (transmission control process) of the above-described (II), and causes the first communication unit 102 (communication unit) to transmit the processing control information generated in the information generation unit 110 via the first communication channel. Also, for example, when the external communication device capable of performing communication through the first communication channel with the external device is connected, the transmission control unit 112 may cause the external communication device to transmit the processing control information.

The control unit 106, for example, initiatively performs a process related to generation of the processing control information according to this embodiment by including the information generation unit 110 and the transmission control unit 112.

Also, the configuration of the control unit provided in the communication device of the side at which the processing control information is generated according to this embodiment is not limited to the above. For example, the communication device of the side at which the processing control information is generated according to this embodiment may further include a notification control unit (not illustrated) configured to cause a display unit (not illustrated), an external display device, or the like to provide various notifications such as an error notification indicating that no processing control information is transmitted.

In addition, for example, the communication device of the side at which the processing control information is generated according to this embodiment can individually include one or more units of the information generation unit 110, the transmission control unit 112, and the notification control unit (when the notification control unit is provided) constituting the control unit (for example, implement each unit using an individual processing circuit).

For example, through the configuration illustrated in FIG. 10, the communication device 100 of the side at which the processing control information is generated according to this embodiment performs the process related to generation of the processing control information according to this embodiment (for example, the process (information generation process) of the above-described (I) and the process (transmission control process) of the above-described (II)). Therefore, the communication device 100 of the side at which the processing control information is generated according to this embodiment, for example, includes the configuration illustrated in FIG. 10, and hence the information processing system capable of more flexibly performing a process corresponding to the processing control information based on the acquired processing control information is implemented.

Also, the configuration of the communication device of the side at which the processing control information is generated according to this embodiment is not limited to the configuration illustrated in FIG. 10.

For example, the communication device of the side at which the processing control information is generated according to this embodiment may not include the second communication unit 104. Even when no second communication unit 104 is provided, the communication device 100 may perform the process (information generation process) of the above-described (I) and the process (transmission control process) of the above-described (II).

In addition, the communication device of the side at which the processing control information is generated according to this embodiment, for example, may include a plurality of second communication units 104 corresponding to different communication schemes. When the plurality of second communication units 104 corresponding to the different communication schemes are provided, the communication device of the side at which the processing control information is generated according to this embodiment can more flexibly perform communication through the second communication channel using common information with the communication device 200 (the communication device of the side at which processing control information is processed).

In addition, the communication device of the side at which the processing control information is generated according to this embodiment, for example, may further include a sound output unit (not illustrated) capable of outputting a sound. Here, an example of the sound output unit (not illustrated) is a DSP and a sound output device. When the sound output unit (not illustrated) is provided, the communication device of the side at which the processing control information is generated according to this embodiment, for example, can provide the user with various notifications such as an error notification indicating that no processing control information is transmitted through a sound output from the sound output unit (not illustrated).

In addition, the communication device of the side at which the processing control information is generated according to this embodiment may further include a configuration (for example, a configuration including a determination unit and a processing unit as will be described later) for enabling a process related to the information processing method according to this embodiment to be performed in the communication device of the side at which the processing control information is processed as will be described later. When the configuration for enabling the process related to the information processing method according to this embodiment as will be described later to be performed is further included, the communication device of the side at which the processing control information is generated according to this embodiment can further function as the communication device of the side at which the processing control information is processed according to this embodiment as will be described later.

[III] Example of Configuration of Communication Device of Side at which Processing Control Information is Processed (Communication Device Configured to Perform Process Related to Information Processing Method According to this Embodiment)

Figure 12:
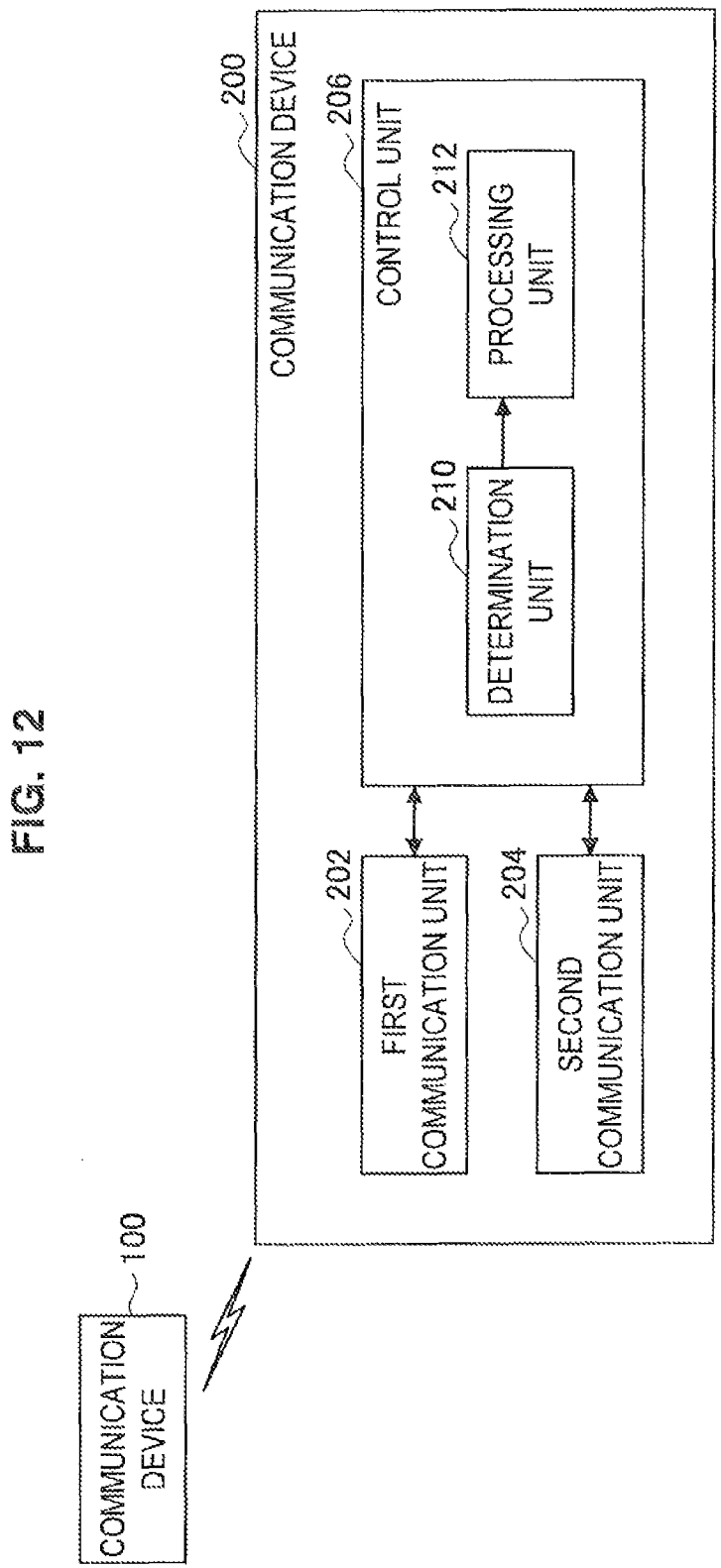
FIG. 12 is a block diagram illustrating an example of a configuration of a communication device of the side at which the processing control information is processed according to this embodiment.

FIG. 12 is a block diagram illustrating an example of the configuration of the communication device 200 of the side at which the processing control information is processed according to this embodiment. Here, in FIG. 12, the communication device 100 of the side at which the processing control information is generated according to this embodiment is also illustrated.

The communication device 200 includes a first communication unit 202, a second communication unit 204, and a control unit 206.

In addition, the communication device 200 may include a ROM (not illustrated), a RAM (not illustrated), a storage unit (not illustrated), an operation unit (not illustrated) capable of being operated by the user, a display unit (not illustrated) configured to display various screens on a display screen, and the like. The communication device 200, for example, establishes a connection between the above-described components by a bus as a transmission channel for data.

Here, the ROM (not illustrated) stores programs to be used by the control unit 206 and control data such as arithmetic parameters. The RAM (not illustrated) temporarily stores programs and the like to be executed by the control unit 206.

The storage unit (not illustrated) is a storage means included in the communication device 200, and, for example, stores various data such as data constituting a UI or an application. Here, examples of the storage unit (not illustrated) may be a magnetic recording medium such as a hard disk, a nonvolatile memory such as a flash memory, and the like. In addition, the storage unit (not illustrated) may be detachable from the communication device 200.

In addition, the operation unit (not illustrated) may be the above-described operation input device, and the display unit (not illustrated) may be the above-described display device.

[Hardware Configuration Example of Communication Device 200]

The communication device 200 according to this embodiment, for example, can be configured through the same hardware configuration as the communication device 100 of the side at which the processing control information is generated according to this embodiment illustrated in FIG. 11.

In the case of the hardware configuration illustrated in FIG. 11, the MPU 150 illustrated in FIG. 11 functions as the control unit 206 configured to control the entire communication device 200. In addition, the MPU 150, for example, functions as a determination unit 210 and a processing unit 212 as will be described later in the communication device 200.

Also, the hardware configuration of the communication device 200 according to this embodiment is not limited to the configuration illustrated in FIG. 11.

For example, the communication device 200 according to this embodiment may not include the second communication interface 166. Even when no second communication interface 166 is provided, the communication device 100 can perform the process related to the information processing method according to this embodiment based on the processing control information acquired by the communication through the first communication channel.

In addition, the communication device 200, for example, may include a plurality of second communication interfaces 166 corresponding to different communication schemes.

When the plurality of second communication interfaces 166 corresponding to the different communication schemes are provided, the communication device 200, for example, can perform a process corresponding to acquired processing control information more flexibly by selectively establishing communication through the second communication channel (other communication channel) based on common information.

In addition, for example, when the communication device 200 is configured to perform communication through the first communication channel or communication through the second communication channel using a connected external communication device, the communication device 200, for example, may not include the first communication interface 164 and/or the second communication interface 166.

In addition, the communication device 100, for example, may further include a DSP and a sound output device. When the DSP and the sound output device are further included, the communication device 200, for example, can provide various notifications such as an error notification indicating that no application corresponding to an application ID is executed through a sound output from the sound output device.

In addition, the communication device 200, for example, can be configured without the operation input device 160 or the display device 162.

An example of the configuration of the communication device 200 will be described with reference back to FIG. 12. The first communication unit 202 functions to communicate with the external device such as the communication device 100 via the first communication channel (one communication channel). Here, an example of the first communication unit 202 is a communication device corresponding to a communication scheme forming the first communication channel such as an NFC interface, an IC chip related to communication by NFC, an infrared communication interface, or the like.

The second communication unit 204 functions to communicate with the external device such as the communication device 100 via the second communication channel (other communication channel). Here, an example of the second communication unit 204 is a communication device corresponding to a communication scheme forming the second communication channel such as a set of an IEEE 802.15.1 port and a transmission/reception circuit or a set of an IEEE 802.11b port and a transmission/reception circuit.

The control unit 206 includes an MPU, various processing circuits, or the like and functions to control the entire communication device 200. In addition, the control unit 206, for example, includes a determination unit 210 and a processing unit 212, and functions to initiatively perform a process related to the information processing method according to this embodiment.

The determination unit 210 functions to initiatively perform the process (determination process) of the above-described (1), and determines a processing mode in which an application is executed based on processing control information including first identification information or second identification information acquired through the first communication channel (one communication channel).

More specifically, when the first identification information is included in the processing control information, the determination unit 210 determines the first processing mode in which an application corresponding to the first identification information is executed. In addition, when the second identification information is included in the processing control information, the determination unit 210 determines the second processing mode in which one or more applications corresponding to the second identification information are executed.

The processing unit 212 functions to initiatively perform the process (execution process) of the above-described (2), and executes an application corresponding to the processing control information based on the processing mode determined in the determination unit 210.

More specifically, when the first identification information is included in the processing control information, that is, when the determination unit 210 determines the first processing mode, the processing unit 212, for example, executes an application corresponding to the first identification information. When a plurality of pieces of the first identification information are included in the processing control information, the processing unit 212 executes an application corresponding to each piece of the first identification information. Here, when there is no application corresponding to the first identification information such as when no application corresponding to the first identification information is stored in the storage unit (not illustrated) or the like, the processing unit 212 does not execute an application corresponding to the processing control information (more strictly, the first identification information).

In addition, when the second identification information is included in the processing control information, that is, when the determination unit 210 determines the second processing mode, the processing unit 212, for example, specifies one or more applications corresponding to the second identification information and executes the specified applications. Here, when no application corresponding to the second identification information is specified or when there is no specified application corresponding to the second identification information, the processing unit 212 does not execute an application corresponding to the processing control information (more strictly, the second identification information).

In addition, for example, when the common information is included in the processing control information as illustrated in FIG. 5, the processing unit 212 may selectively establish communication through the other communication channel with the external device such as the communication device 100 based on the common information included in the processing control information. More specifically, the processing unit 212, for example, selectively establishes the communication through the second communication channel (other communication channel) with the external device performing communication in the first communication channel such as the communication device 100 based on the common information by performing a process related to the first example illustrated in the above-described (2-1) or a process related to the second example illustrated in the above-described (2-2).

The control unit 206, for example, initiatively performs a process related to the information processing method according to this embodiment by including the determination unit 210 and the processing unit 212.

Also, the configuration of the control unit provided in the communication device of the side at which the processing control information is processed according to this embodiment is not limited to the above. For example, the communication device of the side at which the processing control information is processed according to this embodiment may further include a notification control unit (not illustrated) configured to cause a display unit (not illustrated), an external display device, or the like to provide various notifications such as an error notification indicating that no application corresponding to an application ID is executed.

In addition, for example, the communication device of the side at which the processing control information is processed according to this embodiment can individually include one or more units of the determination unit 210, the processing unit 212, and the notification control unit (when the notification control unit is provided) constituting the control unit (for example, implement each unit using an individual processing circuit).

The communication device 200 of the side at which the processing control information is processed according to this embodiment, for example, performs the process related to the information processing method according to this embodiment (for example, the process (determination process) of the above-described (1) and the process (execution process) of the above-described (2)) through the configuration illustrated in FIG. 12.

Here, when the first identification information directly indicating the application is included in the processing control information, the communication device 200 determines the first processing mode in the process (determination process) of the above-described (1). Accordingly, the communication device 200 performs the process to be implemented by the application corresponding to the first identification information, that is, the process to be implemented by an application directly designated in the processing control information, in the process (execution process) of the above-described (2).

In addition, when the second identification information indirectly indicating the application is included in the processing control information, the communication device 200 determines the second processing mode in the process (determination process) of the above-described (1). Accordingly, the communication device 200 performs a process to be implemented by one or more applications corresponding to the second identification information, that is, an application indirectly designated in the second identification information (an application for functioning as a device having a predetermined function corresponding to the second identification information), in the process (execution process) of the above-described (2).

Therefore, the communication device 200 of the side at which the processing control information is processed can more flexibly perform a process corresponding to the processing control information based on the acquired processing control information. In addition, because the communication device 200 of the side at which the processing control information is processed can more flexibly perform the process corresponding to the processing control information, it is possible to deal with various services.

Also, the configuration of the communication device of the side at which the processing control information is processed according to this embodiment is not limited to the configuration illustrated in FIG. 12.

For example, the communication device of the side at which the processing control information is processed according to this embodiment may not include the second communication unit 204. Even when no second communication unit 204 is provided, the communication device 200 may perform the process (determination process) of the above-described (1) and the process (execution process) of the above-described (2).

In addition, the communication device of the side at which the processing control information is processed according to this embodiment, for example, may include a plurality of second communication units 204 corresponding to different communication schemes. When the plurality of second communication units 204 corresponding to the different communication schemes are provided, the communication device of the side at which the processing control information is processed according to this embodiment, for example, can perform a process corresponding to acquired processing control information more flexibly by selectively establishing communication through the second communication channel (other communication channel) based on common information.

In addition, the communication device of the side at which the processing control information is processed according to this embodiment, for example, may further include a sound output unit (not illustrated) capable of outputting a sound. Here, an example of the sound output unit (not illustrated) is a DSP and a sound output device. When the sound output unit (not illustrated) is provided, the communication device of the side at which the processing control information is processed according to this embodiment, for example, can provide the user with various notifications such as an error notification indicating that no processing control information is transmitted through a sound output from the sound output unit (not illustrated).

In addition, the communication device of the side at which the processing control information is processed according to this embodiment may further include a configuration (for example, the configuration including the information generation unit 110 and the transmission control unit 112 illustrated in FIG. 10) in which the process related to generation of the processing control information according to this embodiment can be performed in the communication device of the side at which the above-described processing control information is generated. When the configuration in which the process related to the generation of the processing control information according to this embodiment can be performed as will be described later is further included, the communication device of the side at which the processing control information is processed according to this embodiment can further function as the above-described communication device of the side at which the processing control information is generated according to this embodiment.

Although the communication devices (the communication device of the side at which the processing control information is generated and the communication device of the side at which the processing control information is processed) have been described above as this embodiment, this embodiment is not limited to the above-described type. For example, this embodiment, for example, can be applied to various devices including a communication device such as a portable phone or a smart phone, a computer such as a personal computer (PC), a tablet type device, a video/music reproducing device (or video/music recording and reproducing device), a game machine, and an imaging device such as a digital still camera or a digital video camera.

(Program According to this Embodiment)

[i] Program in Communication Device of Side at which Processing Control Information is Generated A program for causing a computer to function as the communication device (the communication device of the side at which the processing control information is generated) according to this embodiment (for example, a program capable of executing processes related to generation of the processing control information according to this embodiment such as the process (information generation process) of the above-described (I), the process (transmission control process) of the above-described (II), and the like) is executed in the computer, and hence an information processing system capable of more flexibly performing a process corresponding to the processing control information based on the acquired processing control information is implemented.

[ii] Program in Communication Device of Side at which Processing Control Information is Processed A program for causing a computer to function as the communication device (the communication device of the side at which the processing control information is processed) according to this embodiment (for example, a program capable of executing processes related to the information processing method according to this embodiment such as the process (determination process) of the above-described (1), the process (execution process) of the above-described (2), and the like) is executed in the computer, and hence a process corresponding to the processing control information can be more flexibly performed based on the acquired processing control information.

The preferred embodiments of the present disclosure have been described above with reference to the accompanying drawings, whilst the technical scope of the present disclosure is not limited to the above examples. It should be understood by those skilled in the art that various modifications, combinations, sub-combinations and alterations may occur depending on design requirements and other factors insofar as they are within the scope of the appended claims or the equivalents thereof.

Although examples of programs (computer programs) for causing a computer to function as the communication device of the side at which the processing control information is generated according to this embodiment and the communication device of the side at which the processing control information is processed according to this embodiment have been described above, this embodiment can also provide a recording medium storing each program or the two programs.

The above-described configuration shows one example of this embodiment, and, of course, pertains to a technical scope of the present disclosure.

Additionally, the present technology may also be configured as below.

(1) A device including:
a control unit to control determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

(2) The device according to (1),
wherein the determination of the processing mode is based on information transmitted from the external device through the communication channel.

(3) The device according to (2),
wherein the determination of the processing mode is based on whether the first identification information is included in the information transmitted from the external device.

(4) The device according to (2),
wherein the determination of the processing mode is based on whether the second identification information is included in the information transmitted from the external device.

(5) The device according to (1),
wherein, when the second processing mode is determined as the processing mode, the control unit executes an application specified by the control unit and corresponding to the second identification information.

(6) The device according to (1),
wherein, when the second processing mode is determined as the processing mode and no application corresponding to the second identification information is specified, the control unit provides a signal indicating that no application corresponding to the second identification information is specified.

(7) The device according to (6),
wherein a notification is provided at the device based on the signal.

(8) The device according to (6),
wherein the control unit provides the signal to cause the external device to provide a notification.

(9) The device according to (1),
wherein, when the second processing mode is determined as the processing mode and no specified application corresponding to the second identification information is stored at the device, the control unit acquires a specified application from another device.

(10) The device according to (1),
wherein, when the second processing mode is determined as the processing mode and a plurality of applications corresponding to the second identification information are specified, the control unit executes the plurality of applications specified in a predetermined order.

(11) The device according to (1),
wherein, when the second processing mode is determined as the processing mode and a plurality of applications corresponding to the second identification information are specified, the control unit does not execute the plurality of applications specified.

(12) The device according to (5),
wherein the application specified is for executing a function indicated by a specified type corresponding to the second identification information.

(13) The device according to (12),
wherein the specified type includes an operation category.

(14) The device according to (5),
wherein the application specified is a tethering application.

(15) The device according to (5),
wherein the control unit executes the application specified based on a determination whether another communication channel has been established using common information in information transmitted from the external device.

(16) The device according to (15),
wherein the application specified is a tethering application.

(17) The device according to (5),
wherein, when the second processing mode is a recording mode, the control unit records history information of operations of the device in a storage unit.

(18) The device according to (2),
wherein the information transmitted from the external device includes common information related to communication through another communication channel.

(19) The device according to (18),
wherein at least one of environmental information or capability information is set as the common information.

(20) The device according to (19),
wherein the environmental information includes connection information.

(21) The device according to (18),
wherein the control unit controls establishing of the another communication channel based on the common information.

(22) The device according to (1),
wherein the device is a smart phone, portable telephone or tablet type terminal.

(23) The device according to (1)
further comprising:
at least one of a display unit, a communication unit or an operation input device coupled to the control unit.

(24) The device according to (1),
wherein, when the first processing mode is determined as the processing mode, the control unit executes the application corresponding to the first identification information.

(25) The device according to (1),
wherein the control unit selectively establishes communication through another communication channel when common information is included in information transmitted from the external device through the communication channel.

(26) A communication method comprising:
controlling, by a processing unit, determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

(27) A non-transitory recording medium on which is recorded a program executable by a computer, the program comprising:
controlling determination of a processing mode of at least two processing modes and in which an application is executed, wherein the at least two processing modes include a first processing mode in which the application is executed based on first identification information directly indicating the application and a second processing mode in which the application is executed based on second identification information indirectly indicating the application, wherein the first identification information and the second identification information are transmitted from an external device through a communication channel.

(28) A communication device including:
a first communication unit configured to communicate with an external device through one communication channel;
a determination unit configured to determine a processing mode in which an application is executed based on processing control information including first identification information directly indicating the application or second identification information indirectly indicating the application acquired through the one communication channel; and
a processing unit configured to execute the application corresponding to the processing control information based on the determined processing mode.

(29) The communication device according to (28),
wherein, when the processing control information includes the first identification information,
the determination unit determines that the processing mode is a first processing mode in which the application corresponding to the first identification information is executed, and
the processing unit executes the application corresponding to the first identification information, and
wherein, when the processing control information includes the second identification information,
the determination unit determines that the processing mode is a second processing mode in which one or more applications corresponding to the second identification information are executed, and
the processing unit specifies the one or more applications corresponding to the second identification information and executes the one or more specified applications.

(30) The communication device according to (29),
wherein, when there is no application corresponding to the first identification information, when no application corresponding to the second identification information is specified, or when there is no specified application corresponding to the second identification information, the processing unit prevents the application corresponding to the processing control information from being executed.

(31) The communication device according to any one of (28) to (30), further including:
one or more second communication units, each configured to communicate with an external device through another communication channel different from the one communication channel,
wherein the processing control information further includes common information regarding communication through the other communication channel, and
wherein the processing unit selectively establishes the communication through the other communication channel with the external device based on the common information included in the processing control information.

(32) The communication device according to (31),
wherein the common information includes environmental information indicating an establishment state of the communication through the other communication channel, and
wherein the processing unit establishes the communication through the other communication channel with the external device when the environmental information indicates that the other communication channel is not established.

(33) The communication device according to (32),
wherein the common information further includes capability information indicating capability in the communication through the other communication channel,
wherein the processing unit determines whether to establish another new communication channel based on the capability information when the environmental information indicates that the other communication channel is established, and
wherein the processing unit establishes communication through the other new communication channel when determining to establish the other new communication channel.

(34) The communication device according to any one of (28) to (33), wherein a plurality of pieces of the first identification information or the second identification information are included in the processing control information.

(35) A communication device including:
a communication unit configured to communicate with an external device through one communication channel;

an information generation unit configured to generate processing control information including first identification information directly indicating an application or second identification information indirectly indicating the application; and
a transmission control unit configured to cause the communication unit to transmit the processing control information.

(36) An information processing method including:
determining a processing mode in which an application is executed based on processing control information including first identification information directly indicating the application or second identification information indirectly indicating the application acquired through one communication channel; and
executing the application corresponding to the processing control information based on the determined processing mode.

(37) An information processing method including:
generating processing control information including first identification information directly indicating an application or second identification information indirectly indicating the application; and
transmitting the processing control information to an external device through one communication channel.

(38) A program for causing a computer to execute the steps of:
determining a processing mode in which an application is executed based on processing control information including first identification information directly indicating the application or second identification information indirectly indicating the application acquired through one communication channel; and
executing the application corresponding to the processing control information based on the determined processing mode.

(39) A program for causing a computer to execute the steps of:
generating processing control information including first identification information directly indicating an application or second identification information indirectly indicating the application; and
transmitting the processing control information to an external device through one communication channel.

The invention claimed is:

1. A device comprising:
a control unit to control determination of a processing mode of at least two processing modes and in which an application is executed; and
a communication unit to conduct near field communication (NFC),
wherein the at least two processing modes include a first processing mode in which the application to be executed by the device is identified based on first identification information which directly identifies the application and a second processing mode in which the application to be executed by the device is identified based on second identification information which identifies a type of device,
wherein the communication unit is configured to receive, through a communication channel by way of near field communication (NFC), the first identification information and the second identification information transmitted from an external device, and
wherein the control unit is configured (i) to determine whether common information is included in control information received from the external device, and (ii) when a determination result thereof indicates that the common information is included in the received control information, to establish another communication channel which is different from the communication channel,
in which the common information includes environmental information, said environmental information comprising an indication of whether or not communication via the another communication channel is established between the device and the external device.

2. The device of claim 1, wherein the determination of the processing mode is based on information transmitted from the external device through the communication channel.

3. The device of claim 2, wherein the determination of the processing mode is based on whether the first identification information is included in the information transmitted from the external device.

4. The device of claim 2, wherein the determination of the processing mode is based on whether the second identification information is included in the information transmitted from the external device.

5. The device of claim 1, wherein, when the second processing mode is determined as the processing mode, the control unit executes an application specified by the control unit and corresponding to the second identification information.

6. The device of claim 1, wherein, when the second processing mode is determined as the processing mode and no application corresponding to the second identification information is specified, the control unit provides a signal indicating that no application corresponding to the second identification information is specified.

7. The device of claim 6, wherein a notification is provided at the device based on the signal.

8. The device of claim 6, wherein the control unit provides the signal to cause the external device to provide a notification.

9. The device of claim 1, wherein, when the second processing mode is determined as the processing mode and no specified application corresponding to the second identification information is stored at the device, the control unit acquires a specified application from another device.

10. The device of claim 1, wherein, when the second processing mode is determined as the processing mode and a plurality of applications corresponding to the second identification information are specified, the control unit executes the plurality of applications specified in a predetermined order.

11. The device of claim 1, wherein, when the second processing mode is determined as the processing mode and a plurality of applications corresponding to the second identification information are specified, the control unit does not execute the plurality of applications specified.

12. The device of claim 1, wherein, when the second processing mode is determined as the processing mode, the control unit executes an application specified by the control unit and corresponding to the second identification information, and wherein the application specified is for executing a function indicated by a specified type corresponding to the second identification information.

13. The device of claim 12, wherein the specified type includes an operation category.

14. The device of claim 1, wherein, when the second processing mode is determined as the processing mode, the control unit executes an application specified by the control unit and corresponding to the second identification information, and wherein the application specified is a tethering application.

15. The device of claim 1, wherein, when the second processing mode is determined as the processing mode, the control unit executes an application specified by the control unit and corresponding to the second identification information.

16. The device of claim 1, wherein, when the second processing mode is determined as the processing mode, the control unit executes an application specified by the control unit and corresponding to the second identification information, and wherein, when the second processing mode is a recording mode, the control unit records history information of operations of the device in a storage unit.

17. The device of claim 1 further comprising:
at least one of a display unit, a communication unit or an operation input device coupled to the control unit.

18. The device of claim 1, wherein, when the first processing mode is determined as the processing mode, the control unit executes the application corresponding to the first identification information.

19. A communication method comprising:
controlling, by a processing unit, determination of a processing mode of at least two processing modes and in which an application is executed by a device,
wherein the at least two processing modes include a first processing mode in which the application to be executed by the device is identified based on first identification information which directly identifies the application and a second processing mode in which the application to be executed by the device is identified based on second identification information which identifies a type of device, and
wherein the first identification information and the second identification information are received from an external device through a communication channel by way of near field communication (NFC),
said method further comprising
determining, by use of the processing unit, whether common information is included in control information received from the external device, and
when a determination result thereof indicates that the common information is included in the received control information, establishing by use of the processing unit another communication channel which is different from the communication channel,
in which the common information includes environmental information, said environmental information comprising an indication of whether or not communication via the another communication channel is established between the device and the external device.

20. A non-transitory recording medium on which is recorded a program executable by a computer, the program comprising:
controlling determination of a processing mode of at least two processing modes and in which an application is executed by a device,
wherein the at least two processing modes include a first processing mode in which the application to be executed by the device is identified based on first identification information which directly identifies the application and a second processing mode in which the application to be executed by the device is identified based on second identification information which identifies a type of device, and
wherein the first identification information and the second identification information are received from an external device through a communication channel by way of near field communication (NFC),
said program further comprising
determining whether common information is included in control information received from the external device, and
when a determination result thereof indicates that the common information is included in the received control information, establishing another communication channel which is different from the communication channel,
in which the common information includes environmental information, said environmental information comprising an indication of whether or not communication via the another communication channel is established between the device and the external device.

21. The device of claim 1, in which the first identification information is an application ID which directly identifies the application and the second identification information is a device ID which identifies a type of device having a predetermined function which indirectly identifies the application.

22. The device of claim 1, in which the common information further includes capability information which indicates a capability of communication through the another communication channel.

* * * * *